United States Patent
Ishiguro et al.

[19]

[11] Patent Number: 6,146,928

[45] Date of Patent: Nov. 14, 2000

[54] METHOD FOR MANUFACTURING THIN FILM TRANSISTOR, LIQUID CRYSTAL DISPLAY AND ELECTRONIC DEVICE BOTH PRODUCED BY THE METHOD

[75] Inventors: Hideto Ishiguro; Takashi Nakazawa, both of Suwa, Japan

[73] Assignee: Seiko Epson Corporation, Tokyo, Japan

[21] Appl. No.: 09/011,512

[22] PCT Filed: Jun. 4, 1997

[86] PCT No.: PCT/JP97/01891

§ 371 Date: Feb. 4, 1998

§ 102(e) Date: Feb. 4, 1998

[87] PCT Pub. No.: WO97/47046

PCT Pub. Date: Dec. 11, 1997

[30] Foreign Application Priority Data

Jun. 6, 1996 [JP] Japan ................................. 8-144642

[51] Int. Cl.[7] .......................... H01L 21/00; H01L 21/8249
[52] U.S. Cl. .......................... 438/151; 438/152; 438/231; 438/286; 257/632; 257/646
[58] Field of Search .................................. 438/151, 152, 438/286, 231; 257/632, 646, 57

[56] References Cited

U.S. PATENT DOCUMENTS

| | | | |
|---|---|---|---|
| 4,254,161 | 3/1981 | Kemlage et al. | 427/94 |
| 5,313,076 | 5/1994 | Yamazaki et al. | 257/66 |
| 5,376,591 | 12/1994 | Maeda et al. | 437/268 |
| 5,518,940 | 5/1996 | Hodate et al. | 437/41 |
| 5,525,550 | 6/1996 | Kato | 437/238 |
| 5,550,070 | 8/1996 | Funai et al. | 437/41 |
| 5,707,895 | 1/1998 | Wuu et al. | 438/158 |
| 5,843,833 | 12/1998 | Ohtani et al. | 438/486 |
| 5,903,047 | 5/1999 | Liao et al. | 438/763 |

FOREIGN PATENT DOCUMENTS

| | | |
|---|---|---|
| 52-66377 | 6/1977 | Japan . |
| 52-76937 | 6/1977 | Japan . |
| 6-232402 | 8/1994 | Japan . |
| 8-55847 | 2/1996 | Japan . |
| 8-55995 | 2/1996 | Japan . |

OTHER PUBLICATIONS

Sano et al, "High quality SiO2/SI Interfacres of Poly–Crystalline Silicon Thin Film Transistors by Annealing in Wet Atmosphere", IEEE Electron Devices Letters, vol. 16, No. 5, pp. 157–160.

*Primary Examiner*—Son T. Dinh
*Assistant Examiner*—Michael S. Lebentritt
*Attorney, Agent, or Firm*—Oliff & Berridge, PLC

[57] ABSTRACT

A method for making a highly reliable non-single-crystal silicon thin film transistor, in which an underlying $SiO_2$ film 15 is formed on a glass substrate 14 and then a polycrystalline silicon layer 17 is formed thereon. After patterning the polycrystalline silicon layer 17, a gate $SiO_2$ film 18 is formed by an ECR-PECVD process or a TEOS-PECVD process. A gate electrode 19 is formed and source and drain regions 20, 20 are formed by an ion doping process. After forming a $SiO_2$ insulating interlevel film 21 and providing a contact hole 22, an electrode 23 composed of an Al—Si—Cu film is formed. Finally, it is subjected to wet annealing at a temperature of 350° C. for 3 hours.

29 Claims, 23 Drawing Sheets

METHOD FOR MANUFACTURING THIN FILM TRANSISTOR, LIQUID CRYSTAL DISPLAY AND ELECTRONIC DEVICE BOTH PRODUCED BY THE METHOD

BACKGROUND OF THE INVENTION

1. Field of the Invention

The present invention relates to a method for making a thin film transistor using a non-single-crystal silicon thin film suitable for driving elements of, for example, liquid crystal display devices, a liquid crystal display device and an electronic device using the same.

2. Related Art

Thin film transistors using thin films composed of non-single-crystal silicon thin films, such as amorphous silicon and polycrystalline silicon, have been intensively studied and developed. The technologies are expected to be used in various fields, for example, active matrix panels, which permit thin displays by the use of an inexpensive insulating substrate and inexpensive high-performance image sensors.

An example of conventional methods for making the thin film transistor will now be described with reference to FIG. 14. Thin film transistors are classified into two types, that is, a top-gate-type thin film transistor composed of an underlying silicon thin film forming source and drain regions and an overlying gate electrode, and a bottom-gate-type thin film transistor composed of an underlying gate electrode and an overlying silicon thin film. Herein, a top-gate-type thin film transistor is exemplified. The following manufacturing method is cited from "Fabrication of Self-Aligned Aluminum Gate Polysilicon Thin-Film Transistors Using Low-Temperature Crystallization Process", E. Ohno et al.; Jpn. J. Appl. Phys. Vol. 33 (1994), pp. 635–638.

As shown in FIG. 14(a), after a $SiO_2$ buffer layer 2 is formed on a glass substrate 1, an amorphous silicon layer 3 having a thickness of 100 nm is formed thereon by a low-pressure chemical vapor deposition (LPCVD) process. The amorphous silicon layer 3 is annealed in a nitrogen atmosphere at 600° C. for 24 hours. Next, as shown in FIG. 14(b), after patterning the amorphous silicon layer 3, a $SiO_2$ gate insulating film 4 having a thickness of 100 nm is formed by a atmospheric pressure CVD process and is annealed at 600° C. for 12 hours.

Next, as shown in FIG. 14(c), an aluminum (Al) film is formed by a sputtering process and patterned to form a gate electrode 5. Phosphorus or boron is implanted using the gate electrode 5 as a mask to form source and drain regions 6 in the silicon layer 3. Because protons are simultaneously implanted, no annealing is required. Next, as shown in FIG. 14(d), a $SiO_2$ insulating interlevel film 7 is formed by a tetraethoxysilane plasma enhanced CVD (hereinafter referred to as "TEOS-PECVD") process, contact holes 8, 8 are formed in the interlevel film 7, and an aluminum film 9 is finally deposited and formed as an electrode.

The thin film transistor manufactured by the above-mentioned steps is used as a driving element, for example, for a liquid crystal display device for a long period, hence it is important to reduce change in electrical characteristics with time as much as possible and to ensure sufficient reliability. In conventional manufacturing processes of thin film transistors, however, correlations between various parameters in production and reliability of devices have not been clarified, and a manufacturing process with high reliability has not been investigated.

The manufacturing steps (environment and processing atmospheres) and devices must be isolated from moisture in order to ensure reliability as much as possible, however, spin-on-glass films (hereinafter referred to as SOG films) often used as interlevel films for planarization in semiconductor devices have a disadvantage of high moisture absorption. Japanese Patent Laid-Open No. 4-93049 discloses removal of moisture in the SOG film by nitrogen annealing at approximately 430° C. after coating of an SOG film. Further, Japanese Patent Laid-Open No. 4-164351 discloses removal of moisture in an SOG film by annealing, for example, at 400° C. for 30 minutes after the formation of a plasma oxide film on the SOG film.

On the other hand, it has been reported that when a thin film transistor provided with a $SiO_2$ gate insulating film by a PECVD process is annealed at approximately 270° C. in a moist atmosphere, the interface state density between the $SiO_2$ film and the polycrystalline silicon film decreases and thus the threshold voltage (hereinafter referred to as Vth) of the thin film transistor is reduced ("High Quality $SiO_2$/Si Interfaces of Poly-Crystalline Silicon Thin Film Transistors by Annealing in Wet atmosphere", N. Sano et al.; IEEE ELECTRON DEVICE LETTERS, VOL. 16, NO. 5, MAY 1955). According to another report, wet oxygen annealing (moisture-containing oxygen annealing) after deposition of a TEOS-$O_3$ NSG film modifies the film quality into a nonhygroscopic state ("Effect of Low-Temperature Annealing on Hygroscopicity of TEOS-$O_3$ Atmospheric CVD NSG Film", Oda et al.; Semiconductor World, February 1993).

Although these reports refer to the control of the Vth and the improvement in the moisture resistance by employing annealing in moist environments (hereinafter referred to as wet annealing), these do not clarify the correlation between the wet annealing and the reliability of the device, and thus these technologies do not improve the reliability of thin film transistors.

SUMMARY OF THE INVENTION

The present invention is accomplished to solve the above-mentioned problems and it is an object of the present invention to provide a method for making a highly reliable thin film transistor using a non-single-crystal silicon thin film.

In accordance with the present invention for achieving the object, a method for making a thin film transistor comprising a channel region composed of a non-single-crystal silicon thin film facing a gate electrode with a gate insulating film of an field effect transistor therebetween, the method characterized by the gate insulating film comprising a silicon oxide film and the gate insulating film being wet-annealed at least after forming the gate insulating film. For example, the method includes a step of forming a non-single-crystal silicon thin film forming source and drain regions and a channel region on a glass substrate, a step of forming a gate electrode facing the channel region separated by a gate insulating film composed of a silicon oxide film, a step forming source and drain electrodes connected to source and drain regions, respectively, and a step of wet-annealing. Specifically, the gate insulating film may be formed by a PECVD process or a TEOS-PECVD process, and preferably the wet annealing is performed at a temperature of 300° C. or higher and for a duration of one hour or more.

In addition to the above-mentioned steps, a step of forming a silicon oxide insulating interlevel film which covers the non-single-crystal silicon thin film or the gate electrode may be provided and the wet annealing step may be performed after forming the insulating interlevel film. The insulating interlevel film may be a silicon oxide film formed by a TEOS-PECVD process. Alternatively, an underlying insulating film composed of a silicon oxide film may be formed on the glass substrate and the non-single-crystal silicon thin film may be formed on the underlying insulating film, followed by wet annealing. The underlying insulating film may be formed by a PECVD or TEOS-PECVD process, and preferably the film thickness is in the range from 100 nm to 500 nm.

The present invention includes modification of the quality of the films forming a thin film transistor by means of moisture during wet annealing after the formation of the major components in the thin film transistor in order to improve the reliability of the thin film transistor.

Because a thin film transistor cannot be formed on a glass substrate at a high temperature, the temperature must be reduced to 450° C. or less during the entire process. The formation of, for example, a silicon oxide film in a low temperature process forming a thin film transistor on a glass substrate results in a different structure of the silicon oxide film from that in a high temperature process such as thermal oxidation. The silicon oxide film immediately after the deposition in a low temperature process contains a weak bond 11 between a silicon (Si) atom and an oxygen (O) atom, as shown in FIG. 13(a), and the silicon oxide film having such an unstable bond results in a change of the electrical characteristics, for example Vth. During wet annealing, however, water ($H_2O$) penetrates into the silicon oxide film, as shown in FIG. 13(b) and cuts the weak bond 11 to form —OH groups.

Then, as shown in FIG. 13(c), water is eliminated to form a strong bond 12 between the silicon and oxygen atoms. Because the bonds in the silicon oxide film are stabilized by wet annealing in such a manner, change in the electrical characteristics is significantly reduced.

DETAILED DESCRIPTION OF PREFERRED EMBODIMENT

Figure 1A:
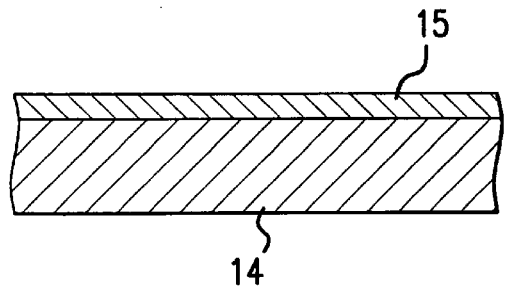
FIGS. 1(a) to 1(e) show a process flow chart of steps of a method for making a thin film transistor in accordance with an embodiment of the present invention.

An embodiment of the present invention will now be described with reference to the drawing figures.

FIGS. 1(a) to 1(e) and FIGS. 2(a) to 2(d) are process flow charts illustrating steps of a method for making a thin film transistor in accordance with this embodiment.

Figure 1B:
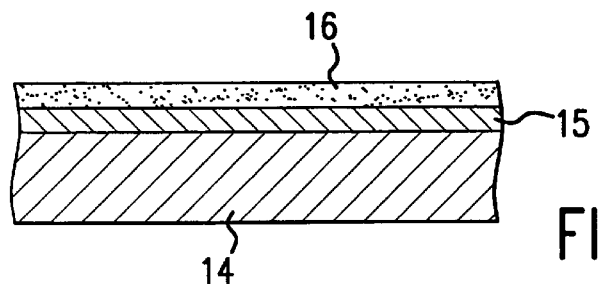

A glass substrate 14, for example, OA-2 (trade name, made by Nippon Electric Glass Co., Ltd.) or 7059 (trade name, by Corning Incorporated), is prepared. As shown in FIG. 1(a), an underlying $SiO_2$ film 15 (silicon oxide film) having a thickness of 100 to 500 nm is formed on the entire glass substrate 14 by a PECVD process using electron cyclotron resonance (hereinafter referred to as "ECR") or a TEOS-PECVD process. Next, as shown in FIG. 1(b) an amorphous silicon layer 16 having a thickness of approximately 50 nm is formed on the entire underlying $SiO_2$ film 15 by an LPCVD process at a temperature of 450° C. using disilane ($Si_2H_6$) or a PECVD process at a temperature of 320° C. using monosilane ($SiH_4$).

Figure 1C:
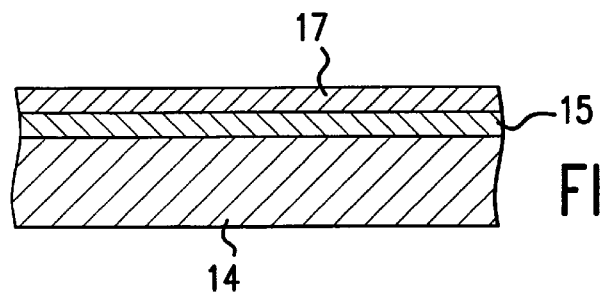
Figure 1D:
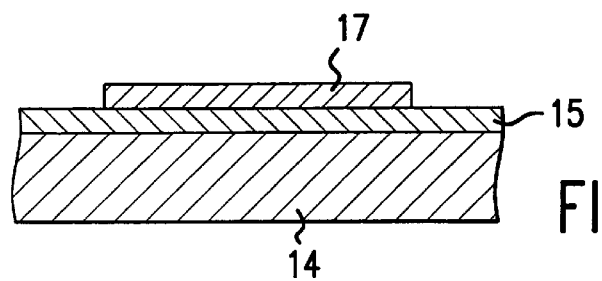
Figure 1E:
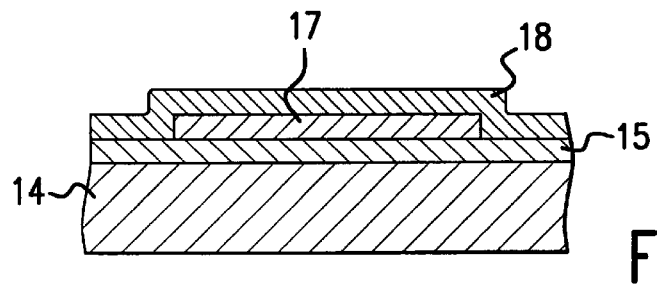

Next, laser annealing is performed on the amorphous silicon layer 16. An excimer laser such as XeCl or KrF is used with an energy density of 200 to 300 mJ/cm$^2$. By the laser annealing, the amorphous silicon layer 16 is crystallized to form a polycrystalline silicon layer 17 (non-single-crystal silicon thin film), as shown in FIG. 1(c). Next, hydrogen ($H_2$) annealing is performed at a temperature of 300° C. After patterning the polycrystalline silicon layer 17 as shown in FIG. 1(d), a gate $SiO_2$ film 18 (silicon oxide film) having a thickness of approximately 120 nm is formed to cover the polycrystalline silicon layer 17 by an ECR-PECVD or TEOS-PECVD process, as shown in FIG. 1(e).

Figure 2A:
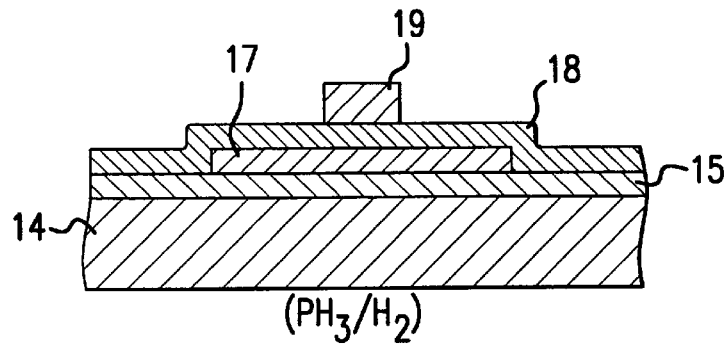
FIGS. 2(a) to 2(d) show a continuation of the process flow chart FIGS. 1(a) to 1(e).

Next, a tantalum (Ta) film having a thickness of 600 to 800 nm is deposited on the entire surface by a sputtering process, and patterned to form a gate electrode 19, as shown in FIG. 2(a).

Figure 2B:
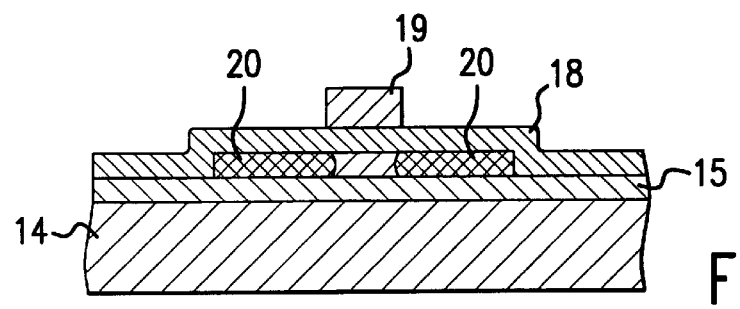

As shown in FIG. 2(b), source and drain regions 20, 20 at a Nch side of the thin film transistor are formed by an ion doping process using $PH_3/H_2$ and the gate electrode 19 as a mask, and then source and drain regions (not shown in the drawing) at a Pch side of the thin film transistor are formed by an ion doping process using $B_2H_6/H_2$. A region between the source and drain regions 20, 20 functions as a channel region. These ion doping processes have a dose rate of approximately $7\times10^{15}$ atoms/cm$^2$.

Next, hydrogen annealing is performed at 300° C. for 2 hours.

Figure 2C:
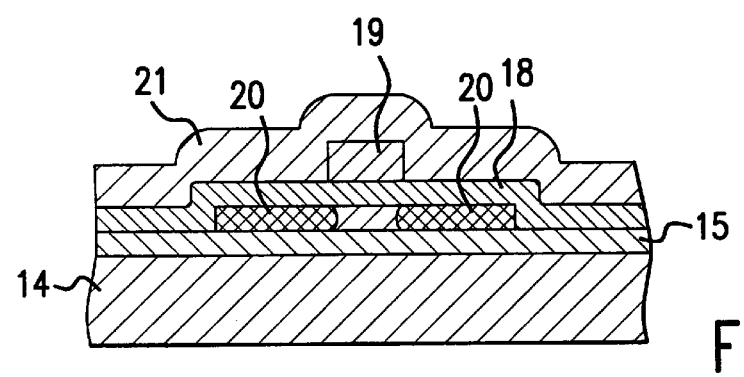
Figure 2D:
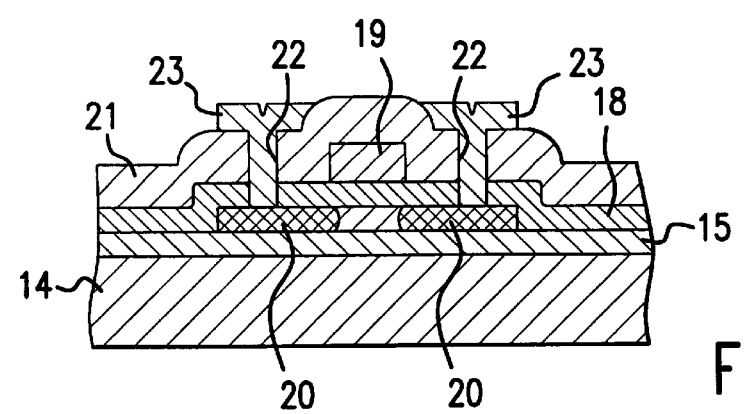

Next, as shown in FIG. 2(c), a $SiO_2$ insulating interlevel film 21 (silicon oxide film) having a thickness of 500 to 1,000 nm is formed by a TEOS-PECVD process. Further, as shown in FIG. 2(d), the insulating interlevel film 21 is opened to form contact holes 22, 22 connected to the source and drain regions 20, 20 on the polycrystalline silicon layer, and an Al—Si—Cu film is deposited on the entire surface and patterned to form electrodes 23, 23 for applying a voltage to the source and drain regions 20, 20. Finally, a wet annealing step according to the present invention is performed. The wet annealing step is performed under the conditions of, for example, a temperature of 350 ° C. for an annealing time of 3 hours in an atmosphere containing water of a partial pressure of 10 Torr or more. Wet annealing for more than 3 hours is also suitable.

In accordance with the method for making a thin film transistor of this embodiment, after the gate electrode facing the source and drain regions 20, 20 and the channel region separated by the gate insulating film is formed, the quality of the silicon oxide films, such as the gate $SiO_2$ film 18, is improved by the wet annealing. That is, during the annealing of the oxide films in a moist atmosphere, weak bonds in the oxide films are hydrolyzed and then recombined by elimination of water, resulting in the stabilization of the oxide films. As a result, the quality of the gate $SiO_2$ film 18, the insulating interlevel film 21 composed of a silicon oxide film, and insulating films such as the underlying insulating film 15 are stabilized, and thus changes in the electrical characteristics of the thin film transistor are reduced, resulting in improved reliability.

EXAMPLES

The experimental results illustrating the advantages of the present invention will now be described.

Polycrystalline silicon thin film transistors made by a method in accordance with the above-described embodiment were subjected to reliability tests. Among various reliability tests, changes in Vgs-Ids characteristics before/after bias temperature treatment (BT treatment or temperature treatment while applying a biasing current) and before/after current stress (stress by an on-current flow) were measured in the present invention. The Vgs-Ids characteristics are fundamental electrical characteristics of transistors.

The polycrystalline silicon thin film transistor had an underlying $SiO_2$ film having a thickness of 200 nm formed by an ECR-PECVD process and a gate $SiO_2$ film having a thickness of 120 nm formed by an TEOS-PECVD process. The TEOS-PECVD process for forming the gate $SiO_2$ film was performed under the conditions of a TEOS flow rate of 105 sccm, an $O_2$ flow rate of 5,000 sccm, a pressure of 1.2 Torr, a high-frequency power of 800 W, a temperature of 350° C., and a deposition rate of 72 nm/min. or less. The gate W/L (gate width/gate length) was 10 μm /10 μm.

Evaluation 1
BT Test

Figure 3:
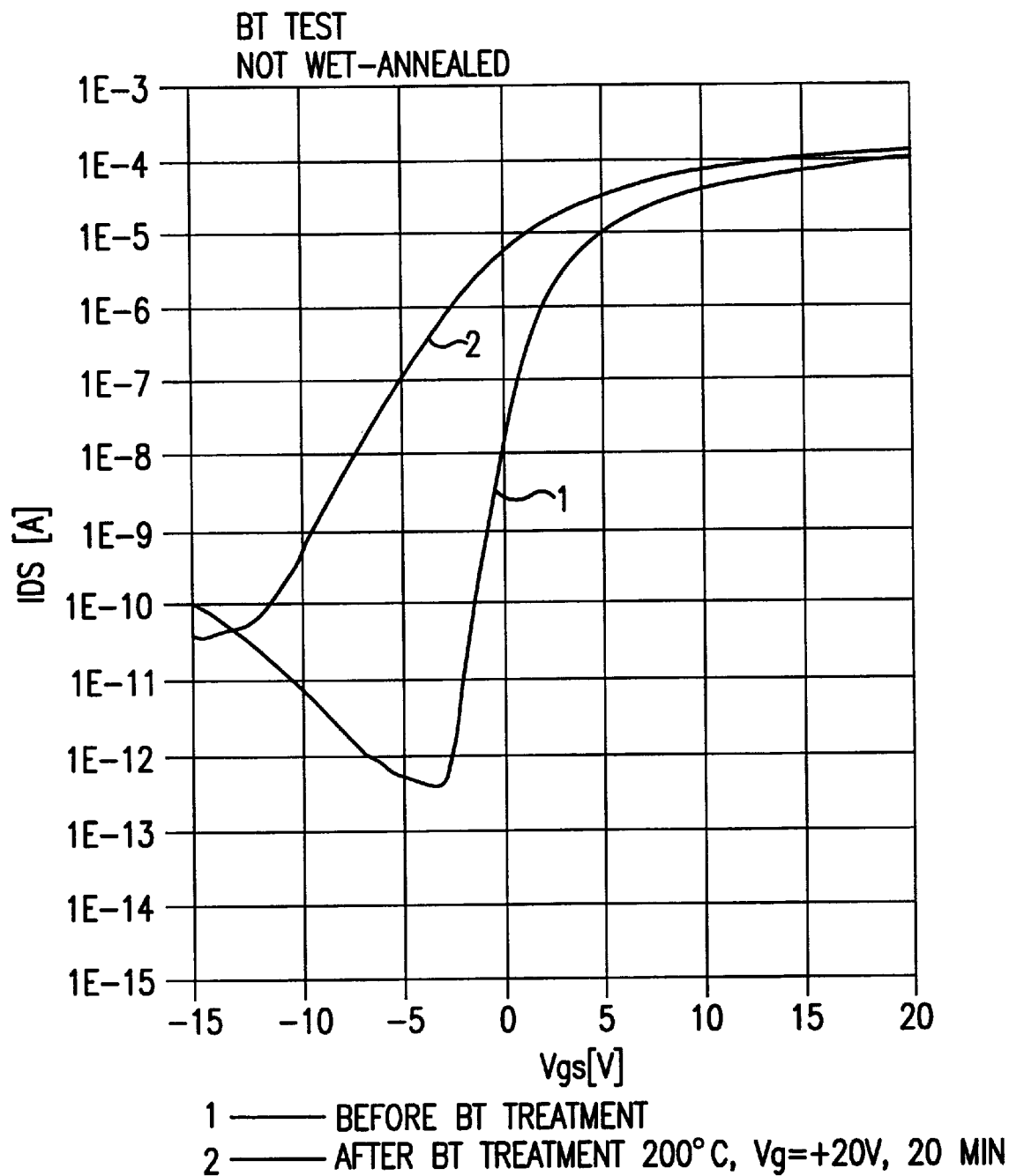
FIG. 3 is a graph illustrating the results of reliability evaluation of an embodiment of the present invention, that is, a graph illustrating the change in Vgs-Ids characteristics by a BT test of a test piece not subjected to wet annealing.
Figure 4:
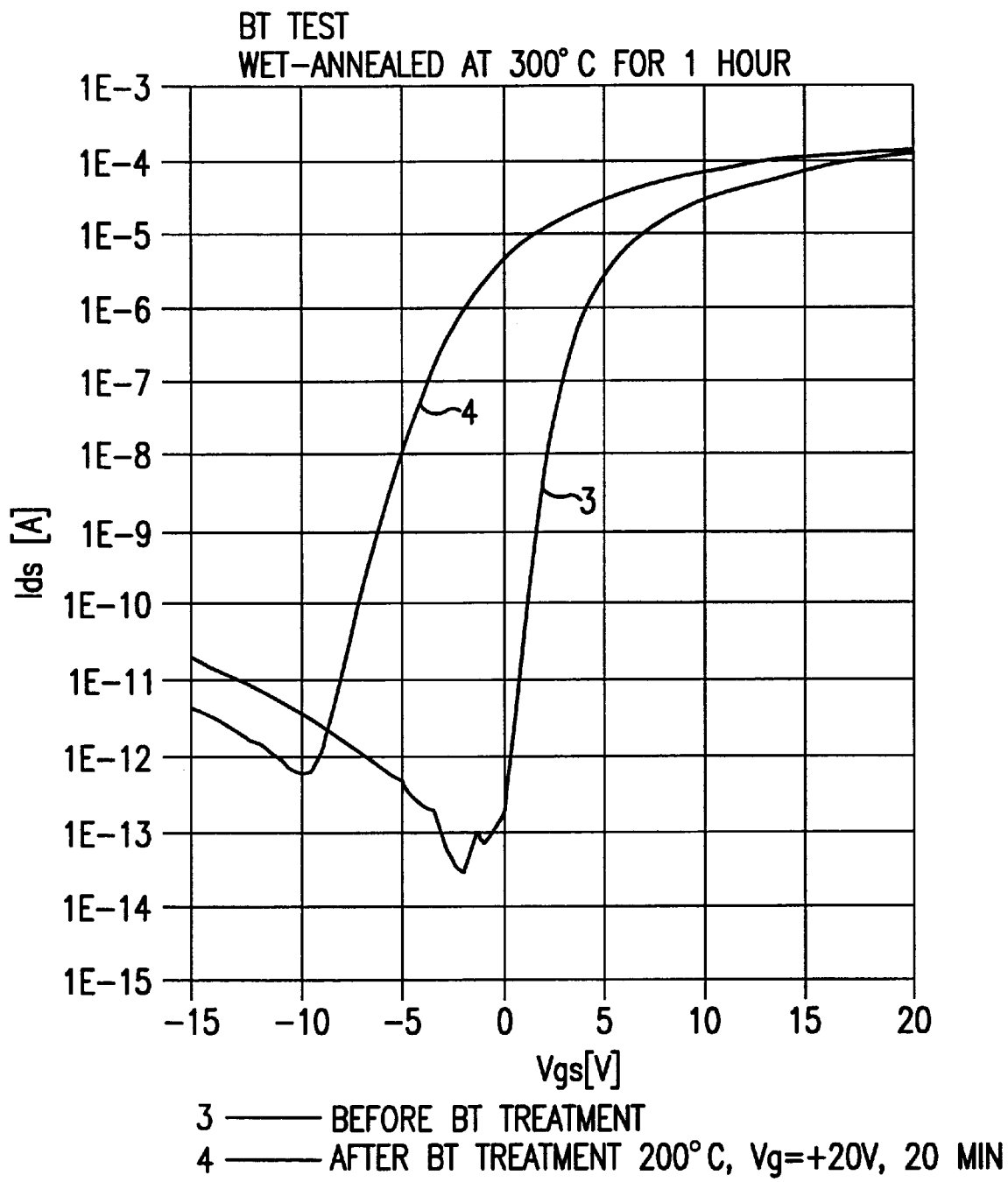
FIG. 4 is a graph of a test piece subjected to wet annealing at 300° C. for 1 hour.
Figure 5:
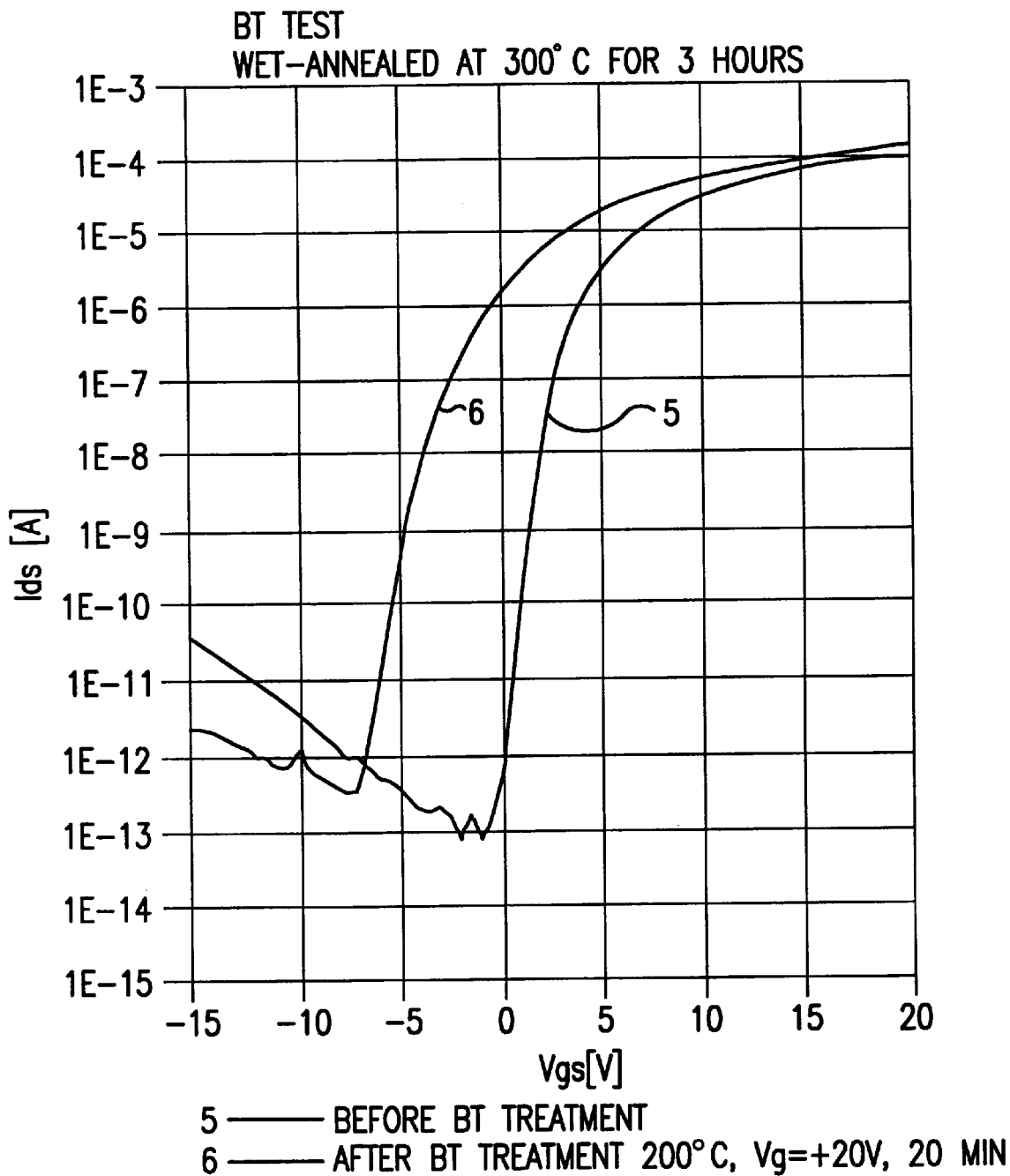
FIG. 5 is a graph of a test piece subjected to wet annealing at 300° C. for 3 hours.
Figure 6:
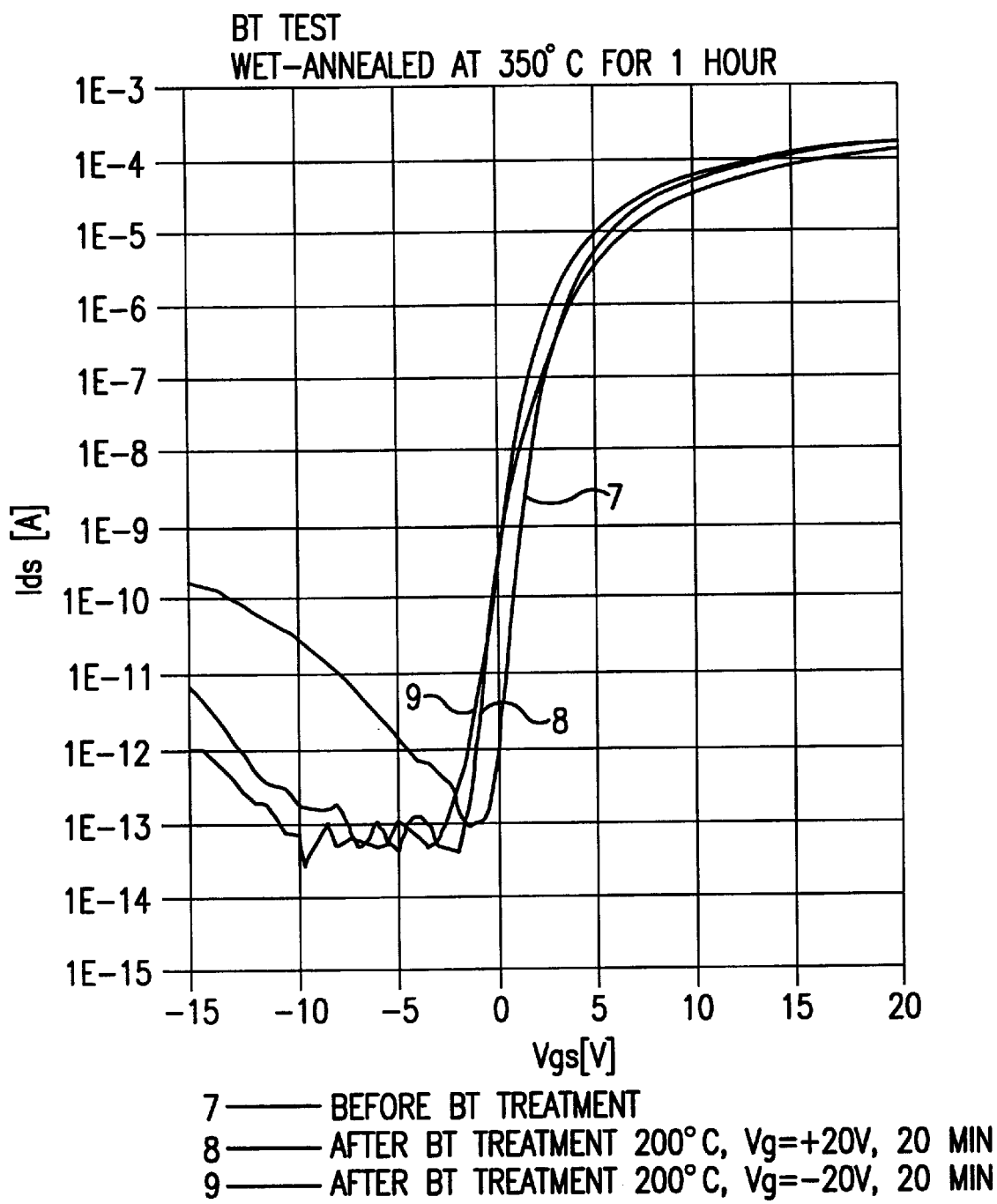
FIG. 6 is a graph of a test piece subjected to wet annealing at 350° C. for 1 hour.
Figure 7:
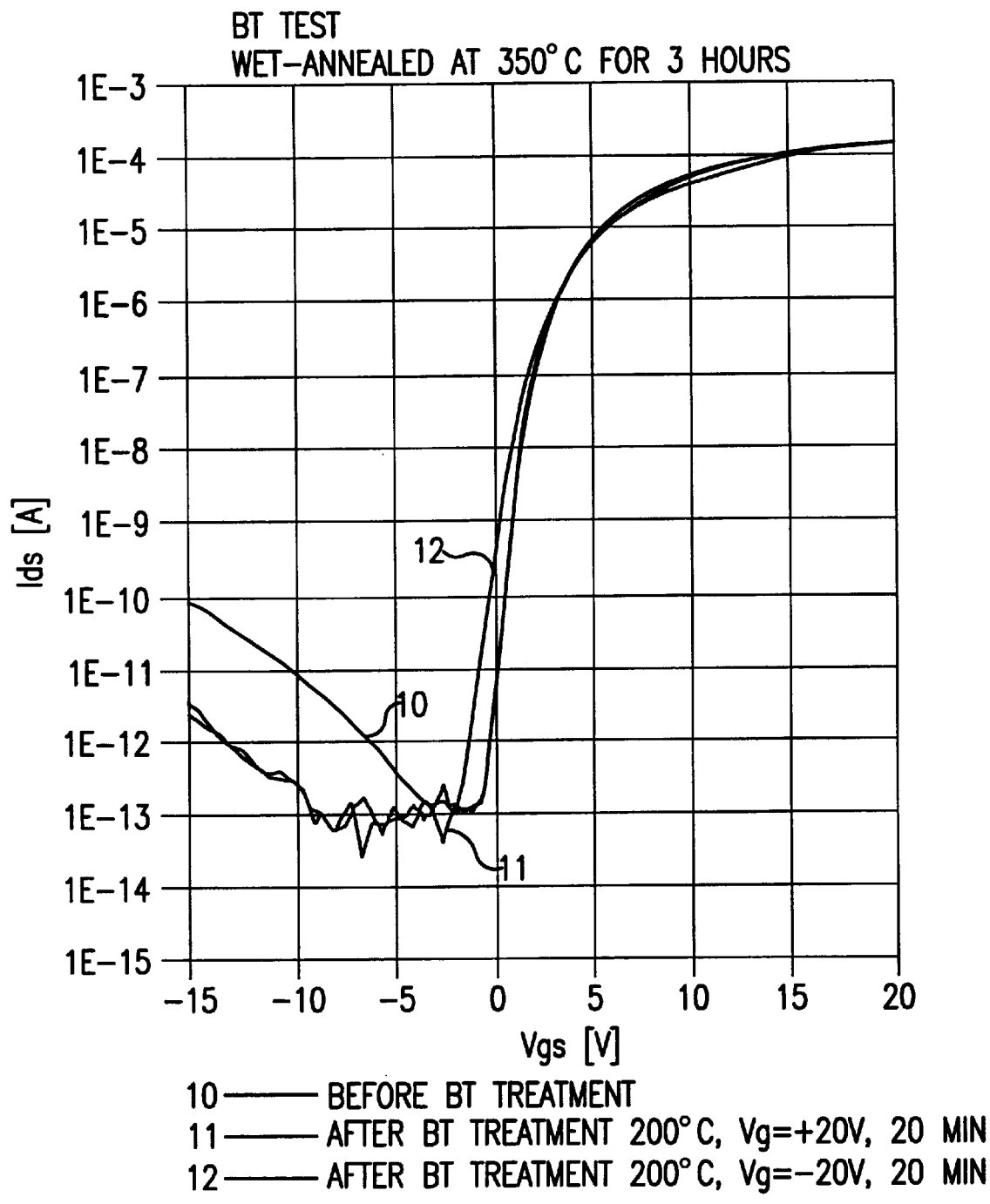
FIG. 7 is a graph of a test piece subjected to wet annealing at 350° C. for 3 hours.
Figure 8:
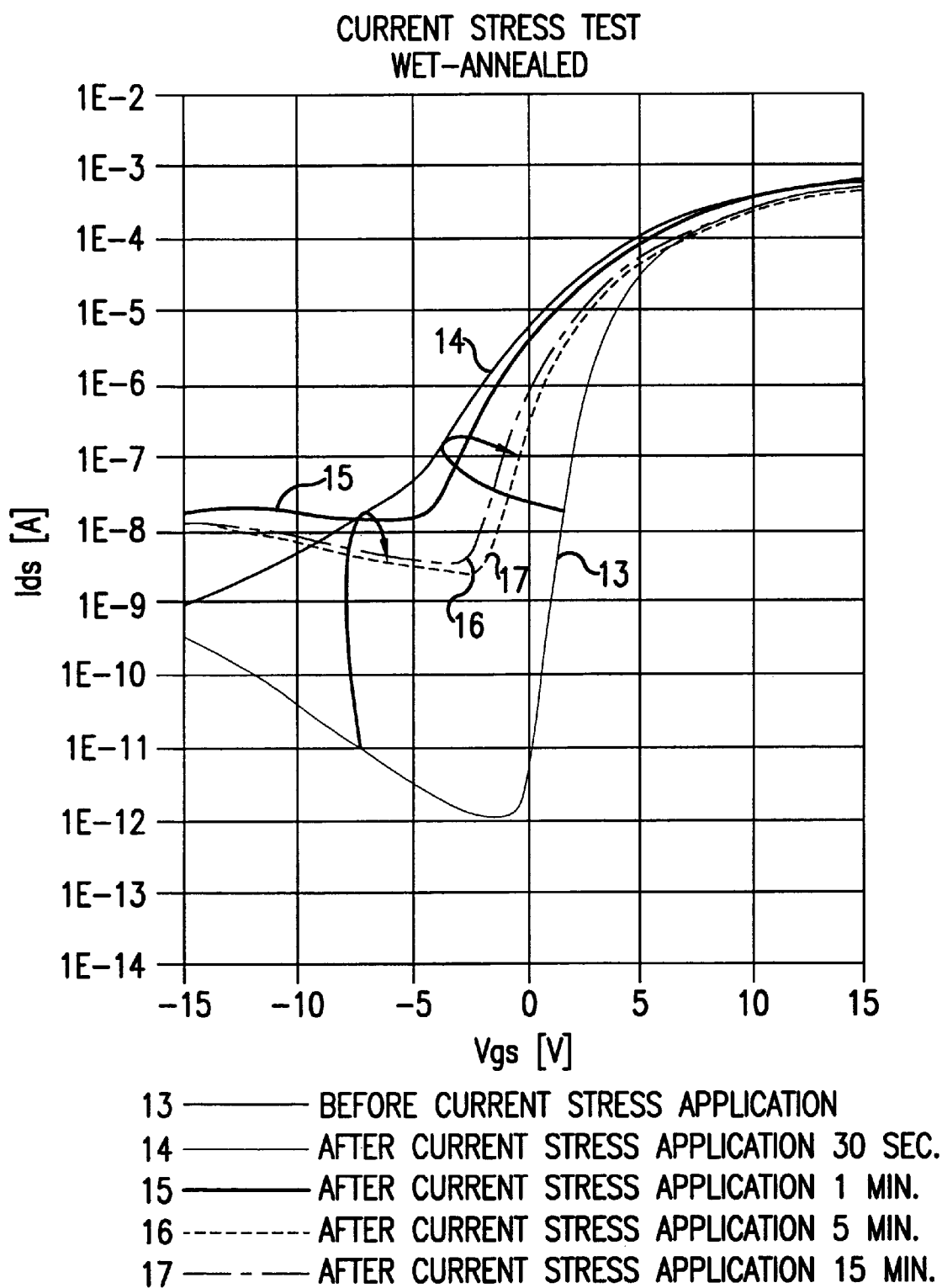
FIG. 8 is a graph illustrating the change in Vgs-Ids characteristics by a current flow stress test of a test piece not subjected to wet annealing.
Figure 9:
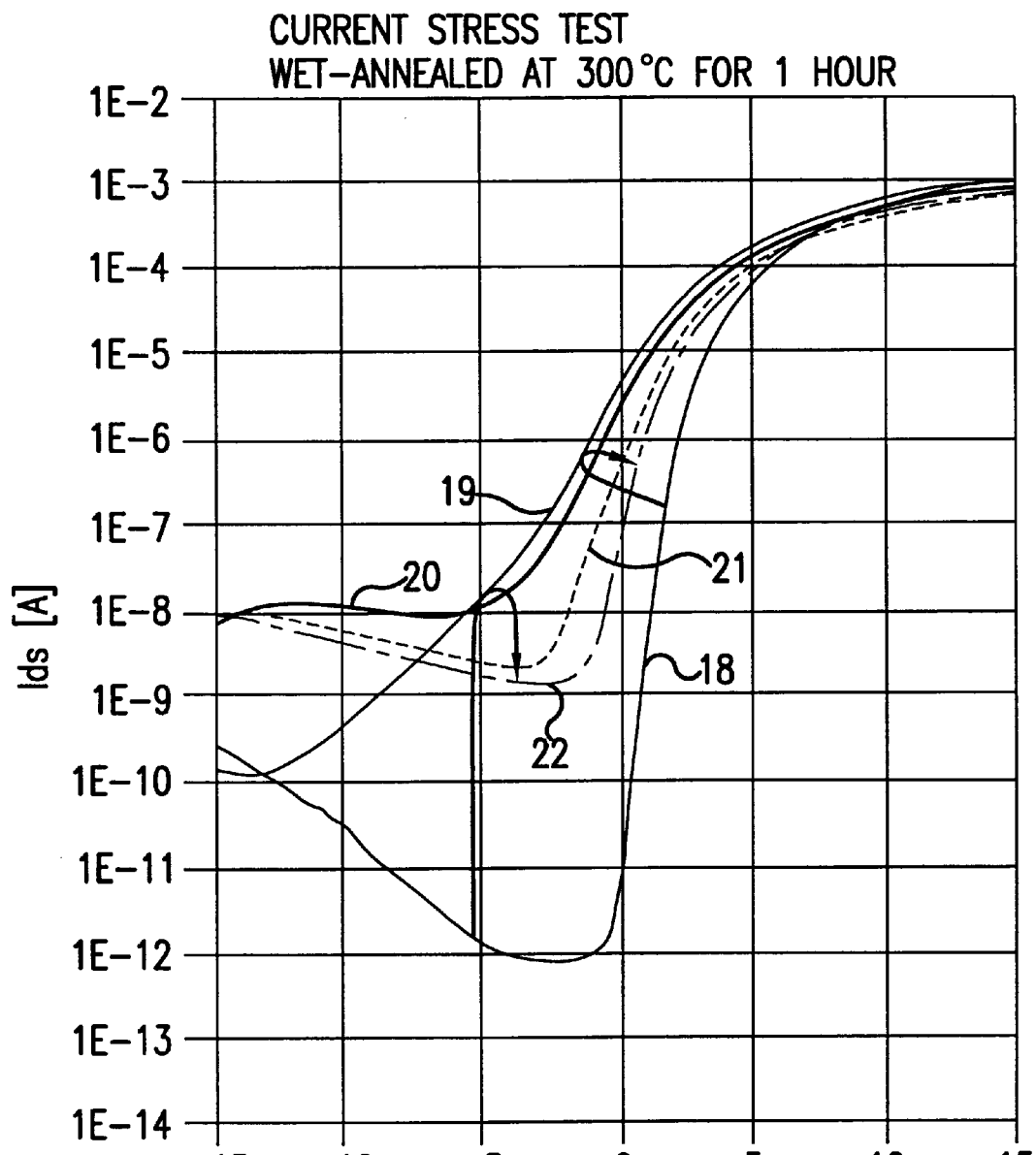
FIG. 9 is a graph of a test piece subjected to wet annealing at 300° C. for 1 hour.
Figure 10:
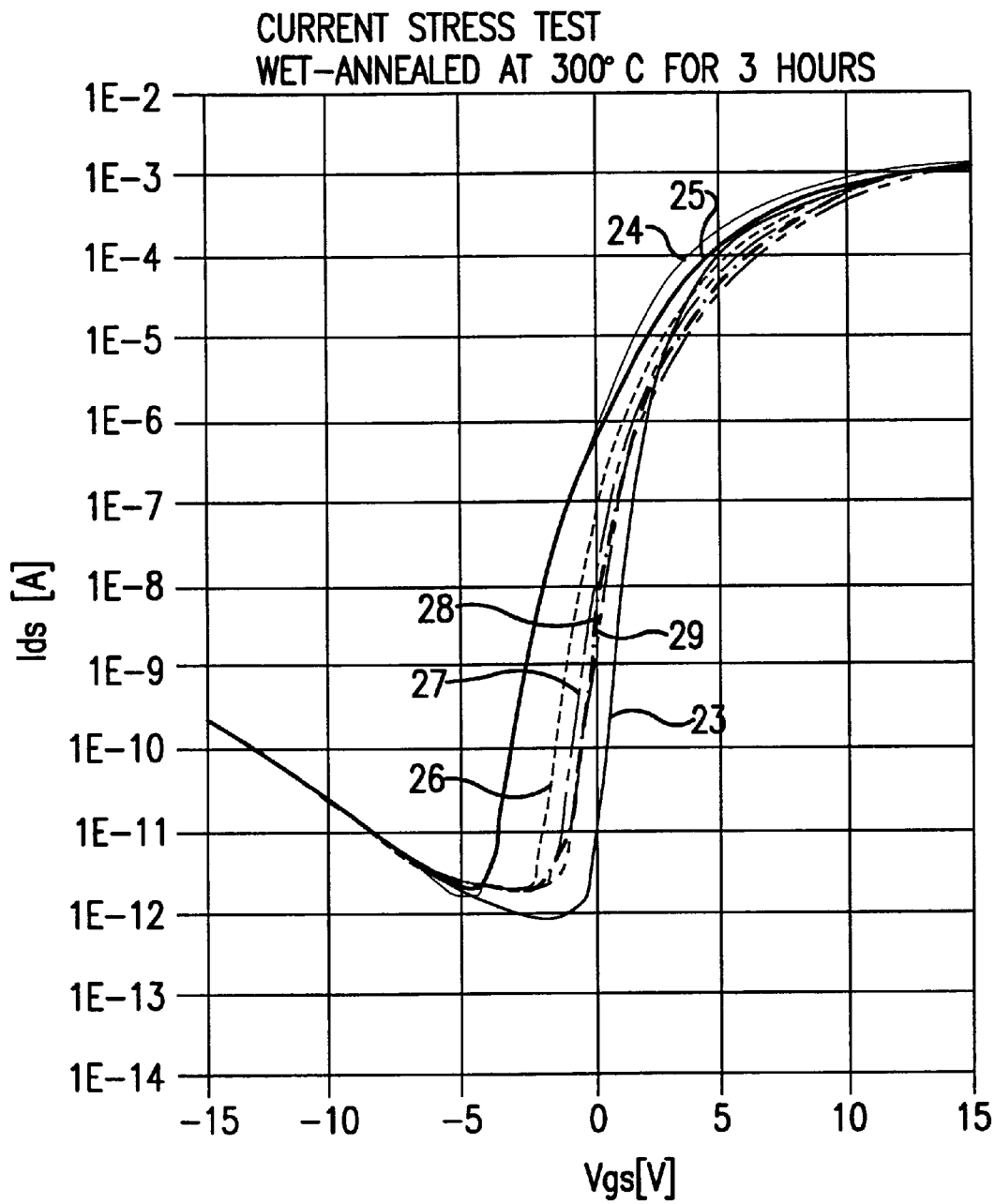
FIG. 10 is a graph of a test piece subjected to wet annealing at 300° C. for 3 hours.

FIG. 3 to FIG. 7 are graphs illustrating BT tests of the samples which were subjected to wet annealing under various conditions (temperatures and times), that is, FIG. 3 for the characteristics of a sample without wet annealing, FIG. 4 for wet annealing at 300° C. for 1 hour, FIG. 5 for wet annealing at 300° C. for 3 hours, FIG. 6 for wet annealing at 350° C. for 1 hour, and FIG. 7 for wet annealing at 350° C. for 3 hours. The BT treatment was carried out at a substrate temperature of 200° C., and a Vgs of +20 V or −20V (the voltage was applied to only the gate, and the source and drain were grounded) for 20 seconds, and the Vgs-Ids characteristics after the BT treatment were measured at a Vds of 4V after the temperature decreased to the room temperature.

In order to compare the changes in the Vgs-Ids characteristics under various treatment conditions, the Vgs value at Ids=1 nA is defined as Vth, and the difference between Vth values before the BT treatment is represented by "ΔVth". Hereinafter, the BT treatment at Vgs=+20 V is referred to as "+BTS", that at Vgs=−20 V is referred to as "−BTS".

The ΔVth values under the treatment conditions determined in accordance with FIG. 3 to FIG. 7 are shown in the following table.

TABLE 1

|  | ΔVth (+BTS) | ΔVth (−BTS) | FIG. |
| --- | --- | --- | --- |
| Without wet annealing | −9.0 V | — | FIG. 3 |
| 300° C. for 1 hour | −7.8 V | — | FIG. 4 |
| 300° C. for 3 hours | −6.0 V | — | FIG. 5 |
| 350° C. for 1 hour | +1.0 V | −0.2 V | FIG. 6 |
| 350° C. for 3 hours | +0.1 V | −0.6 V | FIG. 7 |

TABLE 1 clearly demonstrates that the ΔVth of the sample without wet annealing is −9 V, the ΔVth slightly decreases to −7.8 V by wet annealing at 300° C. for 1 hour and decreases to −6V by extending the annealing temperature to 3 hours at the same temperature. The ΔVth values at +BTS and −BTS significantly decrease to +1 V, and −0.2 V, respectively by wet annealing at 350° C. for 1 hour. The ΔVth values at +BTS and −BTS become less than −1 V by extending the annealing temperature to 3 hours at the same temperature. Accordingly, the results demonstrate that the ΔVth value starts to decrease by wet annealing at 300° C. for 1 hour, and the change in the Vth before/after the BT treatment can be reduced to be 1 V or less at a wet annealing temperature of 350° C. for a duration of at least one hour.

Evaluation 2
Current Stress Test

Polycrystalline silicon thin film transistors used in this test had the same structure as in the BT test, except that the gate size was W/L=100 μm/10 μm.

FIG. 8 to FIG. 12 are graphs illustrating the results of current stress tests of samples subjected to various wet annealing conditions (temperature and time). FIG. 8, FIG. 9, FIG. 10, and FIG. 11 correspond to characteristics with non-wet annealing, at 300° C. for 1 hour, 300° C. for 3 hours, 350° C. for 1 hour, and 350° C. for 3 hours, respectively. The current stress was applied under the conditions of Vgs=+15 V and Vds=+12 V (the source was grounded) and energizing times of 30 seconds, 1 minute, 5 minutes, 15 minutes, 30 minutes and 60 minutes, and the Vgs-Ids characteristics were measured at Vds=4V after completion of the energizing.

Figure 11:
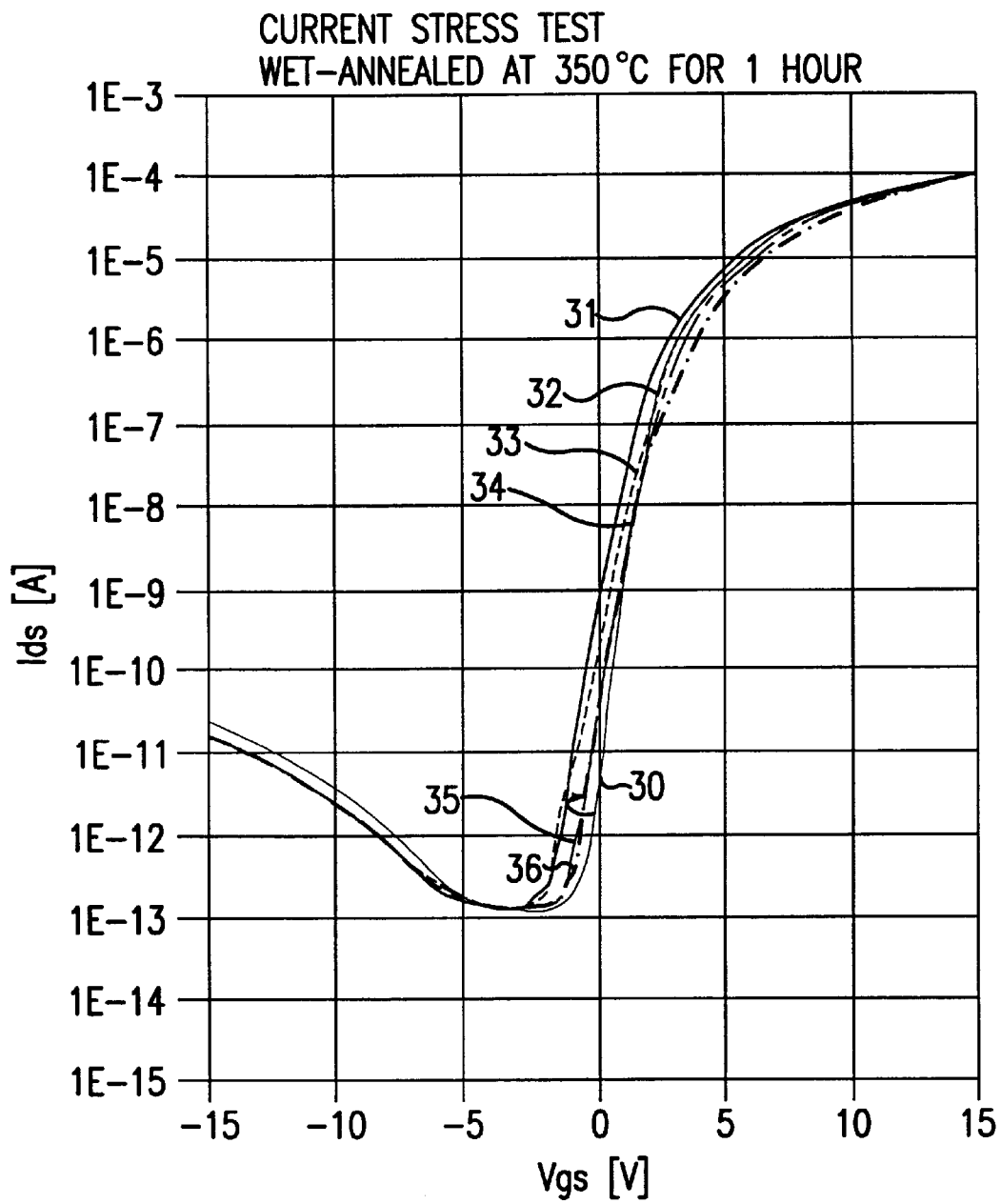
FIG. 11 is a graph of a test piece subjected to wet annealing at 350° C. for 1 hour.
Figure 12:
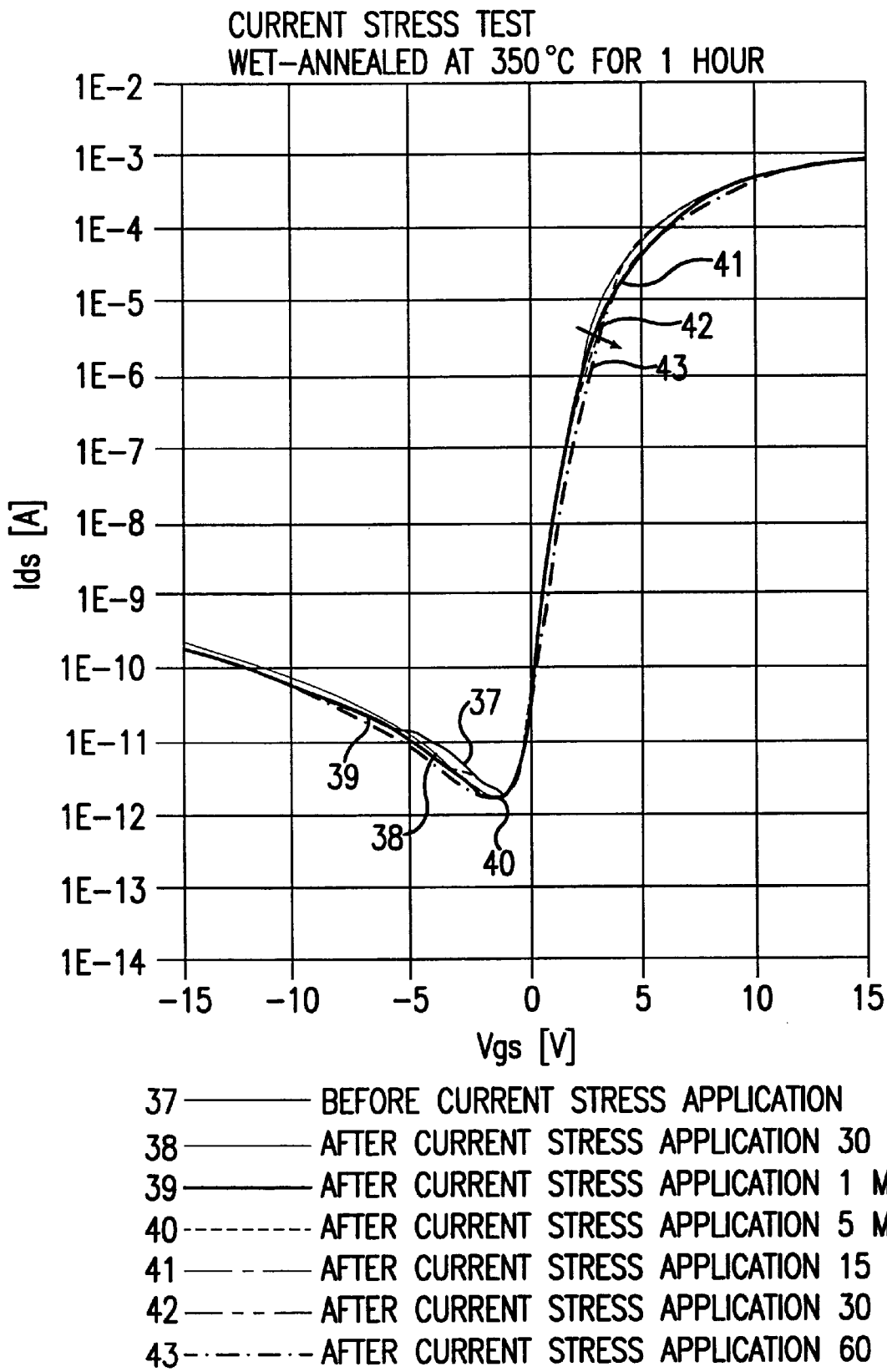
FIG. 12 is a graph of a test piece subjected to wet annealing at 350° C. for 3 hours.
Figure 13A:
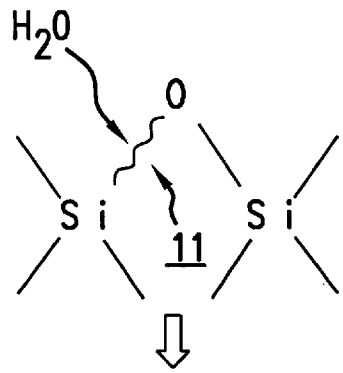
FIGS. 13(a) to 13(c) are schematic views illustrating a mechanism of the improvement in the film quality in accordance with the present invention.
Figure 13B:
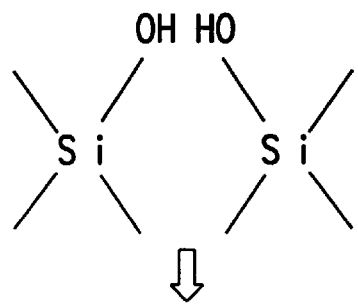
Figure 13C:
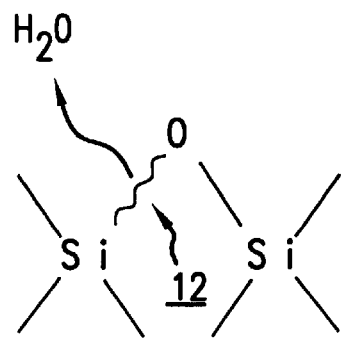
Figure 14A:
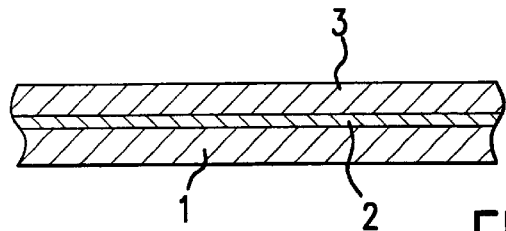
FIGS. 14(a) to 14(d) show a process flow chart of steps of a conventional method for making a thin film transistor.
Figure 14B:
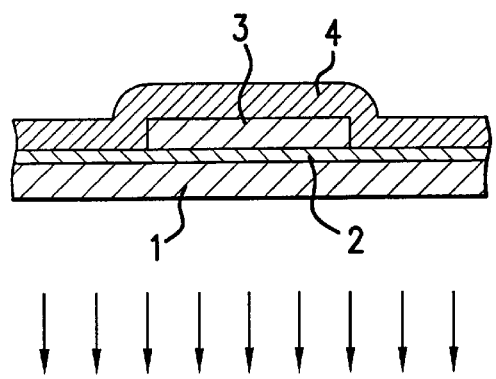
Figure 14C:
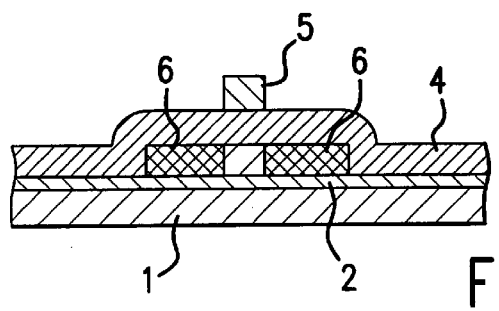
Figure 14D:
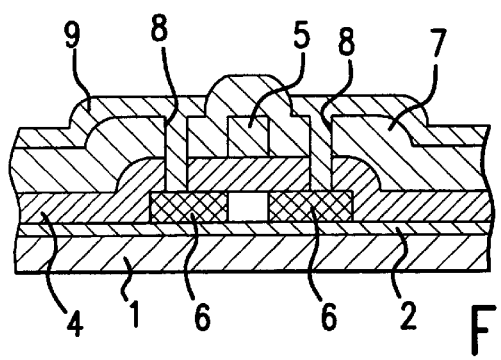

In an overall feature in the current stress test, the Vgs-Ids characteristic curve becomes gentle at a shorter energizing time, for example, 30 seconds compared to that in non-energizing time, and returns to the characteristic curve in non-energizing time at a longer energizing time. Regarding such a change in the characteristic curve, FIG. 8 to FIG. 10 clearly demonstrate that wet annealing at 300° C. for 1 hour, as well as non-wet annealing, gives a large change in the characteristic curve, and such a change slightly decreases by extending the annealing time to 3 hours. FIG. 11 and FIG. 12 clearly demonstrate that there is only a small degree of change in the characteristic curve in the wet annealing process at 350° C. for 1 hour, and, further, the characteristic curve is not substantially changed by extending the annealing time to 3 hours. Accordingly, the results demonstrate that the change in the characteristic curve starts to decrease by wet annealing at 300° C. for 1 hour, and the change in the Vgs-Ids characteristic curve before/after the current stress application can be satisfactorily reduced at a wet annealing temperature of 350° C. for a duration of at least one hour.

The results of the BT and current stress tests illustrate that by the wet annealing at a temperature of 300° C. or more, and preferably at 350° C. or more, for at least one hour, the change in the electrical characteristics can be significantly reduced compared to a conventional manufacturing process without wet annealing, resulting in improved reliability. It is preferable that the wet annealing temperature be within a range from 300° C. to 500° C. because a temperature of higher than 500° C. may eliminate hydrogen embedded into the silicon oxide film.

The apparatus for the wet annealing will be described. The wet annealing is performed, as described above, at a temperature of 300° C. or more, and preferably at 350° C. or more, for at least one hour. Wet annealing using a hot plate and wet annealing using a hot wall system will be described with reference to the drawings.

Figure 22:
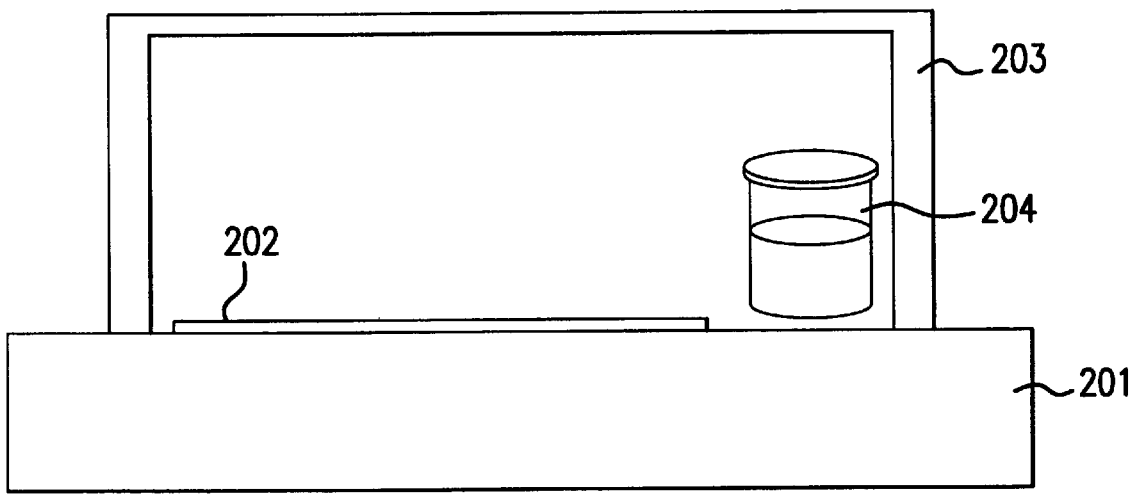
FIG. 22 is a schematic view of wet annealing using a hot plate in accordance with the present invention.

FIG. 22 is a schematic view of the wet annealing using a hot plate.

In FIG. 22, numeral 201 represents a hot plate which is maintained at 300° C. or more and preferably 350° C. or more. A glass substrate 202 provided with a silicon oxide film such as a gate insulating film (underlying insulating film, or insulating interlevel film) is placed on the hot plate 201, and the glass substrate 202 is maintained together with a water-containing vessel 204 in a quartz container 203 for one hour or more. The glass substrate 202 which comes into contact with the hot plate 201 is maintained at approximately 350° C. by the heat from the hot plate 201. The interior of the quartz container 203 is maintained at approximately 100° C. because of evaporation of water. During the wet annealing, moisture ($H_2O$) penetrates into the silicon oxide film, unstable or weak bonds in the silicon oxide film are decomposed to form —OH groups, and thus the quality of the silicon oxide film is improved.

Figure 23:
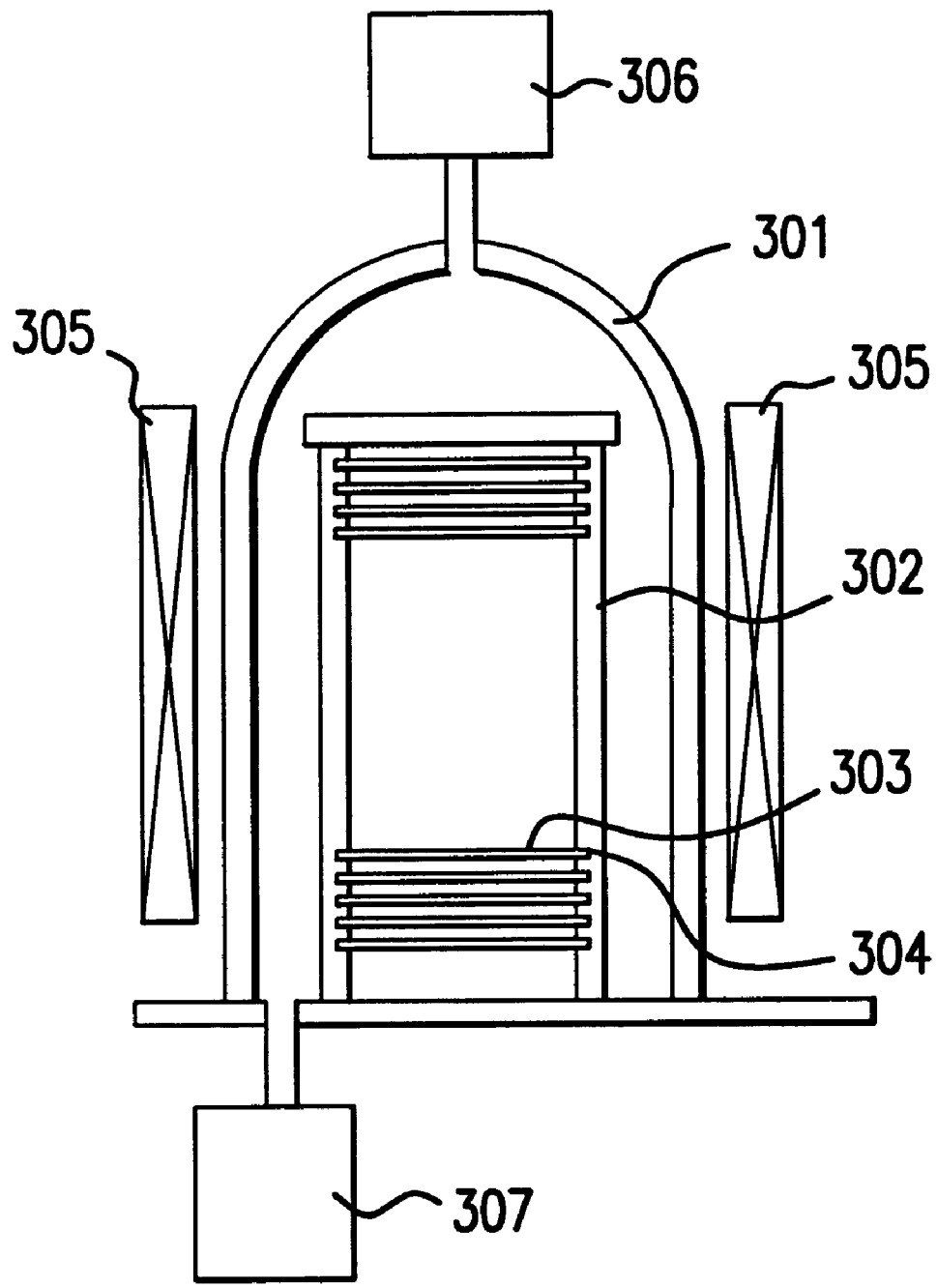
FIG. 23 is a schematic view of wet annealing using a hot wall system in accordance with the present invention.

FIG. 23 is a schematic view of wet annealing using a hot wall system. In FIG. 23, guide grooves 304 are provided on a quartz boat 302 in the near center of a quartz reaction chamber 301 of the hot wall system. Substrates 303 provided with silicon oxide films such as a gate insulating film are placed horizontally along the guide grooves. In FIG. 23, although the glass substrate 303 is placed horizontally, it may be placed vertically or obliquely. A furnace heater 305 is provided on the outside of the quartz reaction chamber 301. The furnace heater 305 heats the interior of the quartz reaction chamber 301 to a given temperature. Numeral 306 represents a gas inlet unit and controls the flow rate of gas introduced into the quartz reaction chamber 301. Numeral 307 represents a gas exhaust unit provided on the quartz reaction chamber 301 which evacuate gas in the quartz reaction chamber 301 and controls the quartz reaction chamber 301 to a constant pressure. The gas exhaust unit 307 may be provided with a pump in order to rapidly exchange the gas in the quartz reaction chamber 301.

An operational procedure of the hot wall system is explained. The interior of the quartz reaction chamber 301 is heated to 350° C. to 500° C. and preferably approximately 350° C., and nitrogen is introduced through the gas inlet unit 306 to remove air in the quartz reaction chamber 301. After the quartz reaction chamber 301 is heated to a given temperature of about 350° C., the glass substrate 303 provided with the silicon oxide film such as a gate insulating film is inserted into the quartz reaction chamber 301 while continuing supply of nitrogen gas. The glass substrate 303 is maintained until it is heated to a given temperature of about 350° C. Steam is supplied instead of nitrogen into the quartz reaction chamber 301 through the gas inlet unit 306. The steam may be formed by bubbling water, or combustion of hydrogen with oxygen. It is preferable that the partial pressure of the steam introduced into the quartz reaction chamber 301 through the gas inlet unit 306 be 10 Torr or more. The gas introduced into the quartz reaction chamber 301 is exhausted from the gas exhaust unit 307, and the quartz reaction chamber 301 is maintained to a given pressure, for example, an atmospheric pressure. The glass substrate 303 is maintained at a temperature of 300° C. or more for a given time, for example 1 hour to 3 hours and is wet-annealed. After the wet annealing, the gas introduced into the quartz reaction chamber 301 through the gas inlet unit 306 is changed from the steam to oxygen or nitrogen, and the steam in the quartz reaction chamber 301 is evacuated from the gas exhaust unit 307 to reduce condensation in the quartz reaction chamber 301. The glass substrate 303 is removed from the quartz reaction chamber 301.

The hot wall system makes the control of the flow rate of the steam easier than the hot plate, makes the temperature of the glass substrate uniform, and maintains the quartz reaction chamber to a high temperature of 300° C. or more. The quality of the silicon oxide film is therefore more effectively improved. According to experimental results, the overall spin density of the silicon oxide film is $9 \times 10^{17}$ spins/cm³ when using the hot plate, and $3 \times 10^{17}$ spins/cm³ when using the hot wall system with a partial pressure of water of 10 Torr or more, and thus the spin density when using the hot wall system decreases to approximately one third. The reliability of the FTF wet-annealed using such a hot wall system is significantly improved.

The technical scope of the present invention is not limited to the above-mentioned embodiment, and various modifications may be added within the scope. Although a top-gate-type thin film transistor is exemplified in the above-mentioned embodiment, the present invention is also applicable to a bottom-gate-type thin film transistor in which a gate electrode lies at a lower layer and a silicon thin film lies at a higher layer. Amorphous silicon instead of polycrystalline silicon may be used in the silicon thin film. The thicknesses of the films and the conditions in the manufacturing steps can be modified according to demand.

In the above-mentioned embodiment, the wet annealing is performed after forming the gate electrode facing the source and drain regions and the channel region separated by the gate insulating film. Another wet annealing step may be provided after forming the underlying $SiO_2$ film, after forming the gate $SiO_2$ film or after forming the insulating interlevel film. When wet annealing is performed immediately after forming the silicon oxide film, moisture rapidly penetrates into the silicon oxide film and thus the annealing time can be reduced to several minutes.

Figure 15:
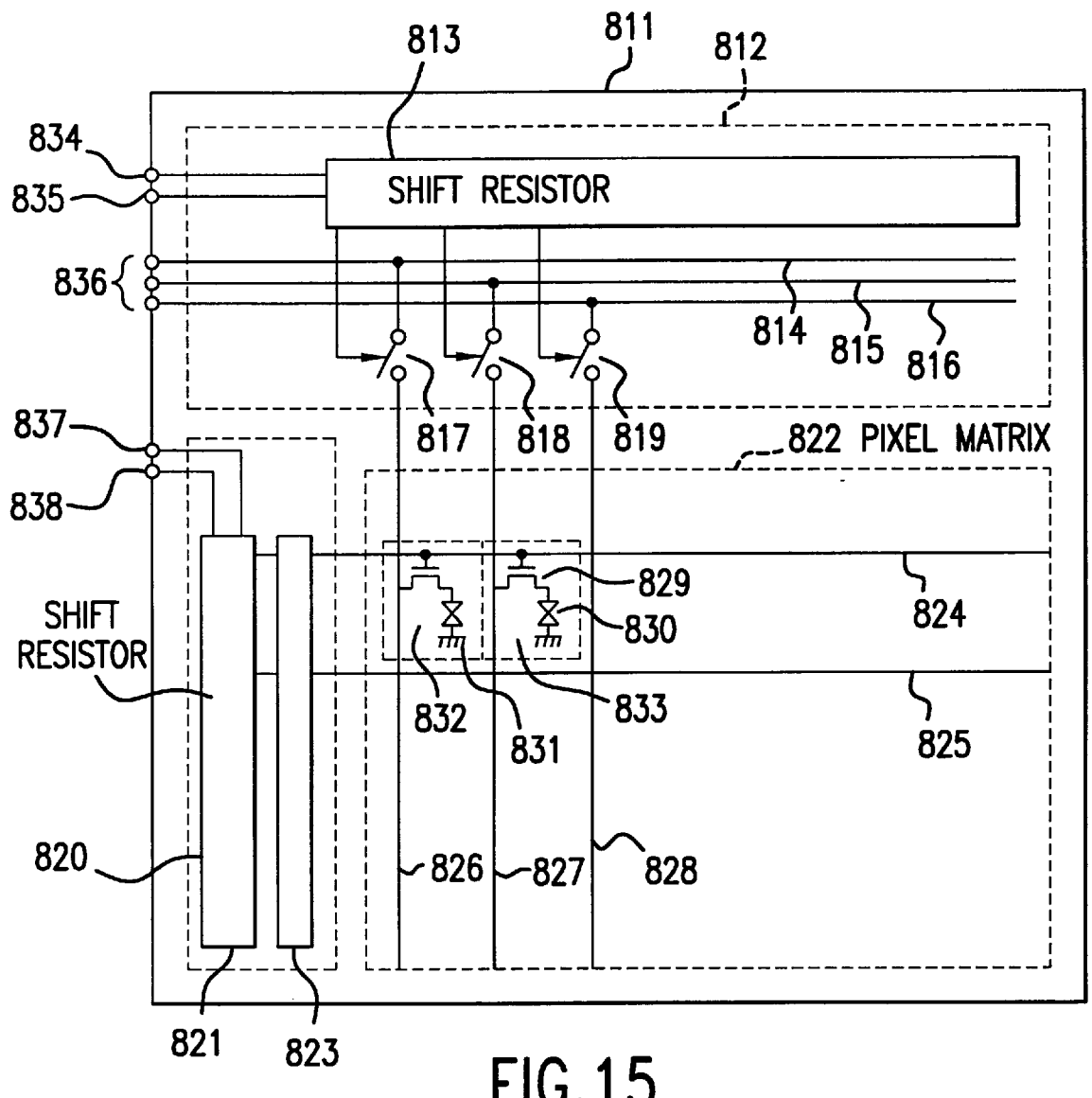
FIG. 15 is a schematic view of an active matrix substrate configuration in a liquid crystal display device or the like formed by a method for making a thin film transistor in accordance with the present invention.

FIG. 15 shows an active matrix substrate configuration such as a liquid crystal display device formed by the above-mentioned method for making the thin film transistor.

In the active matrix substrate 811 shown in FIG. 15, a source line driver circuit 812 and a gate line driver circuit 821, of a complementary thin film transistor composed of a silicon thin film, are formed together with a pixel matrix 822 on a common transparent substrate. The source line driver circuit 812 includes a shift resistor 813, sample hold circuits 817, 818, 819 and video signal busses 814, 815 and 816, and the gate line driver circuit 821 includes a shift resistor 820 and a buffer 823 if necessary. The pixel matrix 822 includes a plurality of source lines 826, 827 and 828 connected to the source line driver circuit 812, a plurality of gate lines 824 and 825 connected to the gate line driver circuit 821, and pixels 833, 833 connected to the source lines and gate lines. Each pixel includes a TFT 829 and a liquid crystal cell 830 comprising a pixel electrode, a counter electrode 831 and a liquid crystal. The shift resistors 813 and 820 may be replaced with other circuits having functions for sequentially selecting the source lines and gate lines, for example, counters or decoders. A clock signal CLX, a start signal DX, and video signals V1, V2 and V3 are input to the input terminals 834, 835 and 836, respectively, of the source line driver circuit, whereas a clock signal CLY and a start signal DY are input to the input terminals 837 and 838, respectively, of the gate line driver circuit.

A liquid crystal display device (liquid crystal display panel) manufactured by using the above-mentioned active matrix substrate will now be exemplified.

Figure 16:
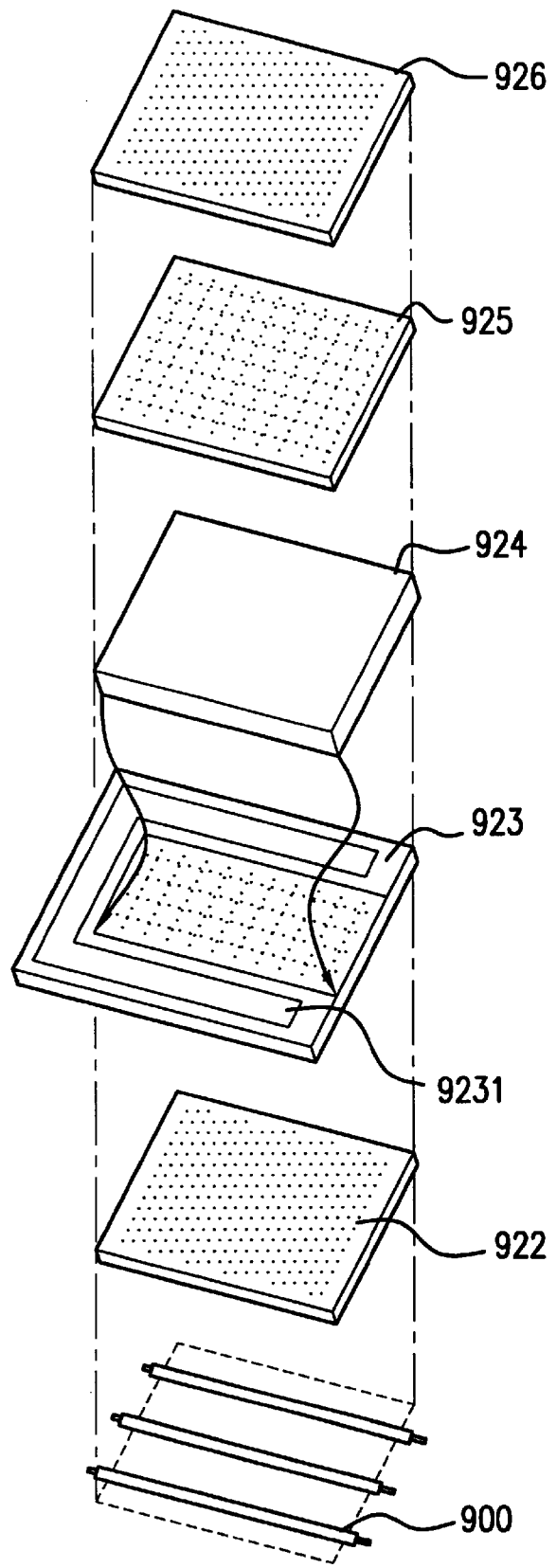
FIG. 16 is an exploded view of a liquid crystal display device (liquid crystal display panel) configuration based on an active matrix substrate formed by a method for making a thin film transistor in accordance with the present invention.

The liquid crystal display device (liquid crystal display panel) includes, as shown in FIG. 16, for example, a back light 900, a polarization plate 922, an active matrix substrate 923, a driver circuit section 9231 provided on the active matrix substrate, a liquid crystal 924, a counter substrate (color filter substrate) 925 and a polarization plate 926.

Figure 17:
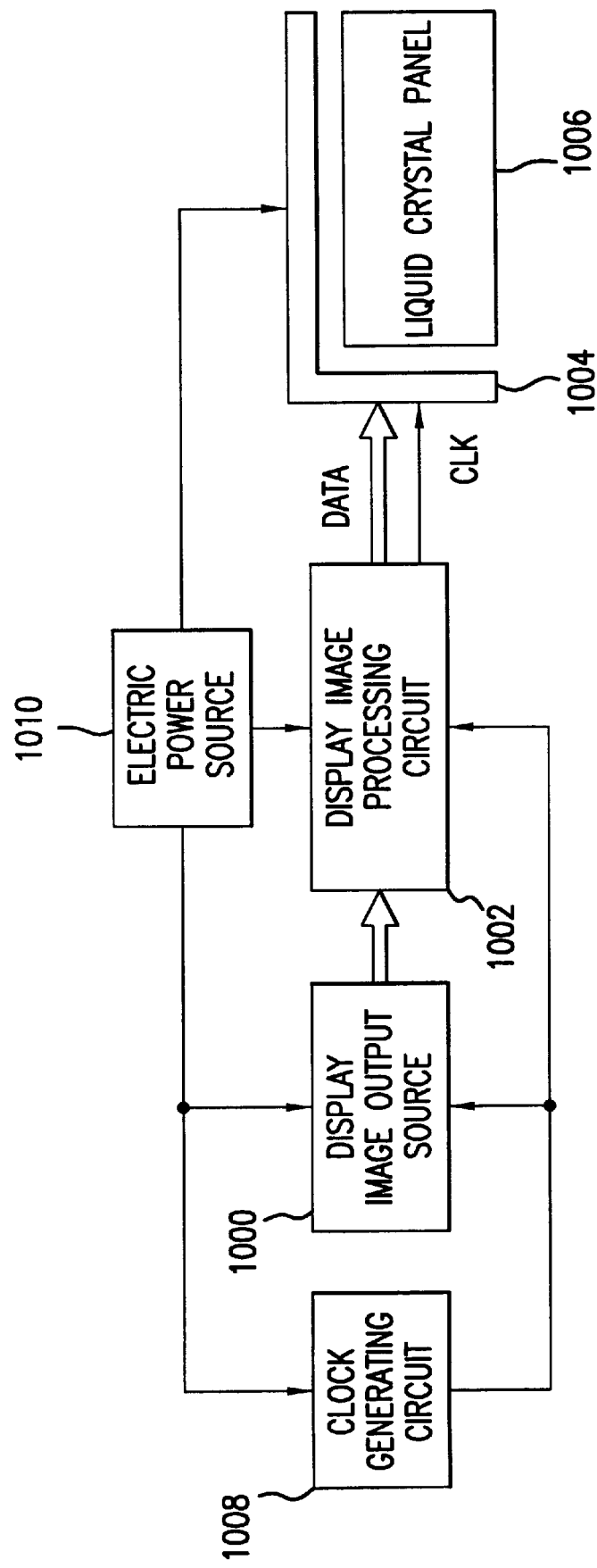
FIG. 17 is an electronic device using a liquid crystal display device formed in an embodiment of the present invention.

An electronic apparatus formed of the liquid crystal display device (liquid crystal display panel) includes, as shown in FIG. 17, a display image output source 1000, a display image processing circuit 1002, a display driving circuit 1004, a display panel 1006 such as a liquid crystal panel, a clock generating circuit 1008 and an electric power source 1010. The display image output source 1000 includes memories, such as ROMs and RAMs, and a tuning circuit for tuning and outputting television signals, and outputs display information, for example, video signals based on clocks from the clock generating circuit 1008. The display image processing circuit 1002 processes and outputs display information based on clocks from the clock generating circuit 1008. The display image processing circuit 1002 may include an amplifying and polarization reversion circuit, a circuit with parallel data input, a rotation circuit, a gamma correction circuit and/or a clamp circuit. The display driving circuit 1004 includes a scanning line driving circuit and a data line driving circuit and drives the liquid crystal panel 1006 for display. The electrical power circuit 1010 supplies electrical power to these circuits.

Figure 18:
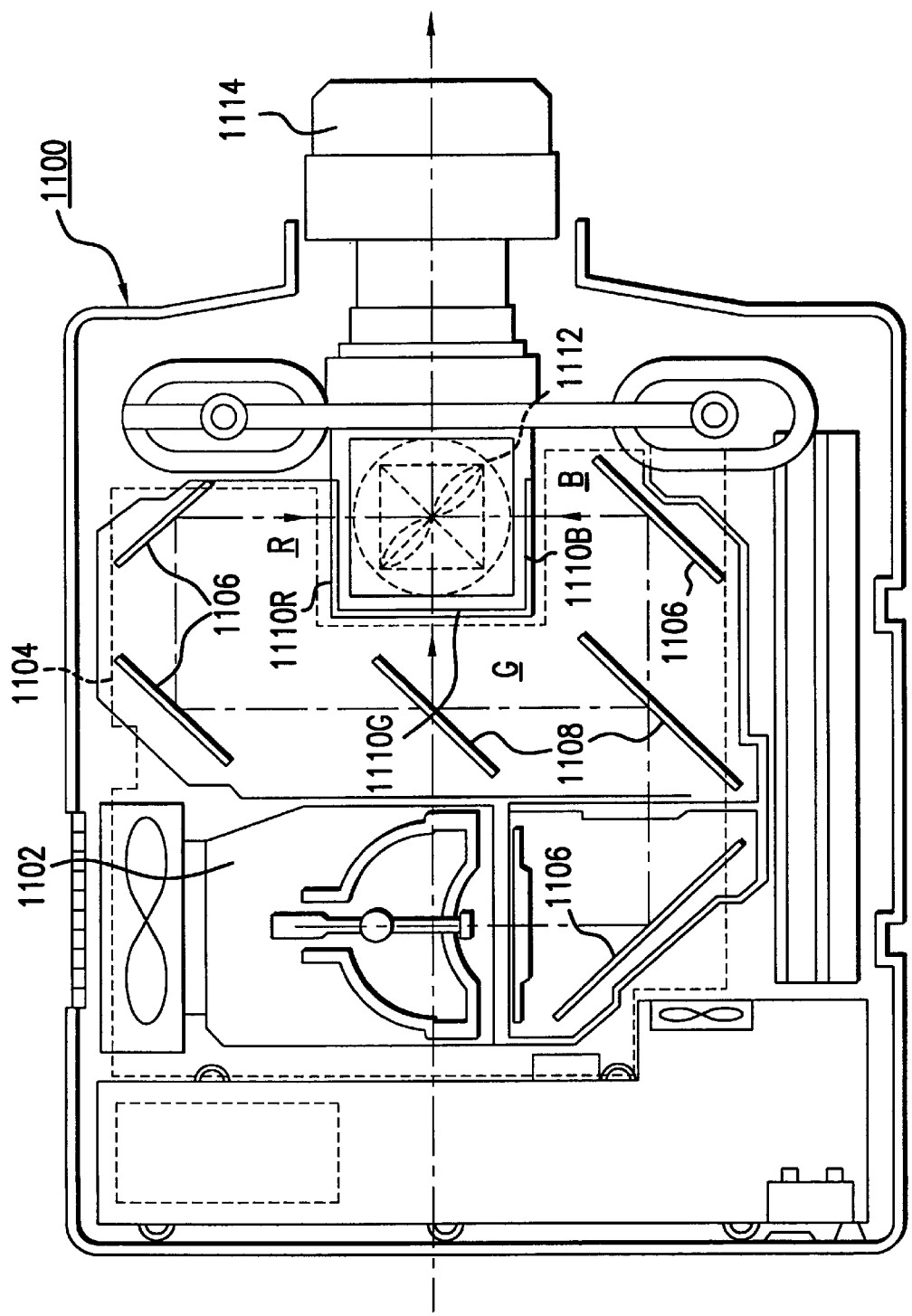
FIG. 18 shows a liquid crystal projector configuration as an example of an electronic device formed in an embodiment of the present invention.
Figure 19:
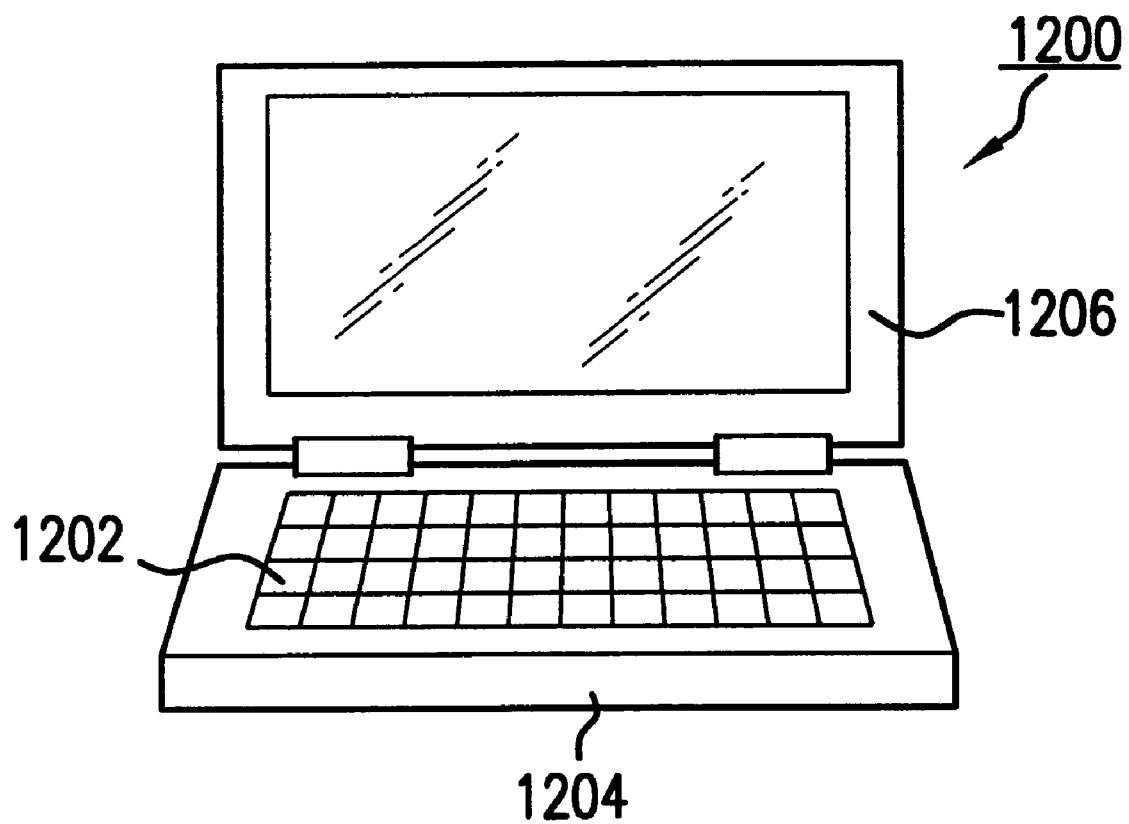
FIG. 19 shows a personal computer configuration as an example of an electronic device formed in an embodiment of the present invention.
Figure 20:
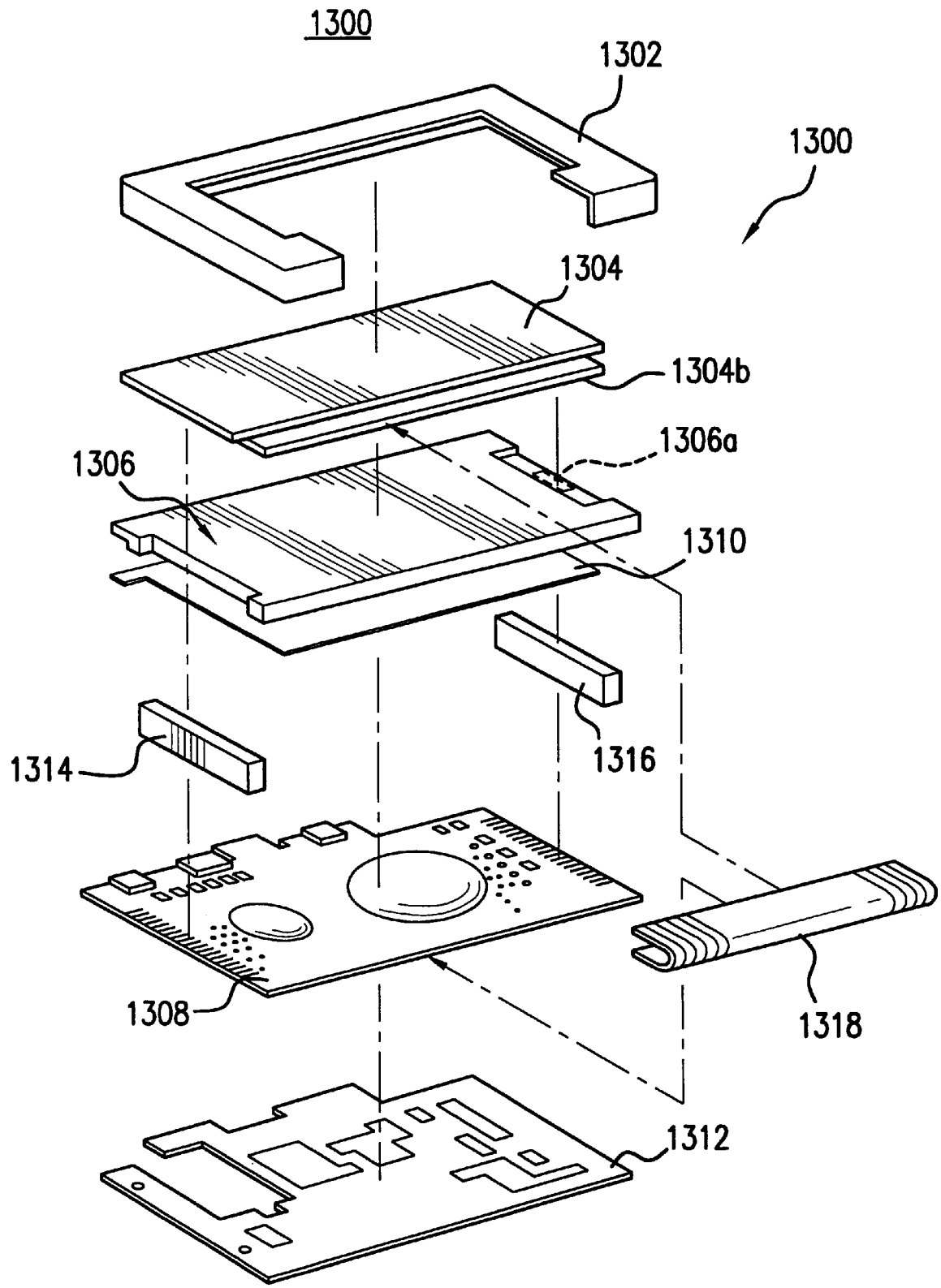
FIG. 20 shows an exploded view of a pager configuration as an example of an electronic device formed in an embodiment of the present invention.

Examples of electronic apparatuses having such a configuration include liquid crystal projectors as shown in FIG. 18, personal computers (PC) as shown in FIG. 19, engineering work stations for multimedia, pagers as shown in FIG. 20, portable phones, word processors, electronic notebooks, portable electronic calculators, car navigation systems, POS terminals, and other devices provided with touch panels.

The liquid crystal projector shown in FIG. 18 uses a transparent liquid crystal panel as a light valve including, for example, a triple-prism-type optical system.

In the projector 1100 shown in FIG. 18, projection light emerging from a lamp unit 1102 for a white light source is separated into three primaries, R, G and B by a plurality of mirrors 1106 and two dichroic mirrors 1108 inside a light guide 1104, and the three primaries are introduced into their respective liquid crystal panel 1110R, 1110G and 1110B. Light beams modulated in the liquid crystal panels 1110R, 1110G and 1110B are incident on a dichroic prism 1112 from three directions. Red light beams R and blue light beams B are bent by 90° in the dichroic prism 1112 whereas green beams G go straight ahead, hence these separated images are synthesized and a color image is projected onto a screen through a projection lens 1114.

The personal computer shown in FIG. 19 includes a main body 1204 provided with a keyboard and a liquid crystal display screen 1206 comprising a liquid crystal panel.

The pager shown in FIG. 20 includes a liquid crystal display substrate 1304, a light guide provided with a back light 1306a, a circuit board 1308, first and second shielding plates 1310 and 1312, two elastic conductors 1314 and 1316, and a film carrier tape 1318 which are packaged in a metallic frame 1302. The two elastic conductors 1314 and 1316 and the film carrier tape 1318 are provided for connecting the liquid crystal display substrate 1304 with the circuit substrate 1308.

The liquid crystal display substrate 1304 is composed of two transparent substrates 1304a and 1304b and a liquid crystal panel encapsulated therebetween and forms a dot-matrix-type liquid crystal display panel. A driving circuit 1004 shown in FIG. 17 and a display information processing circuit 1002 may be provided on one transparent substrate. Other circuits not mounted on the liquid crystal display substrate 1304 can be mounted on the circuit board 1308 in FIG. 18 as external circuits of the liquid crystal display substrate.

Figure 21:
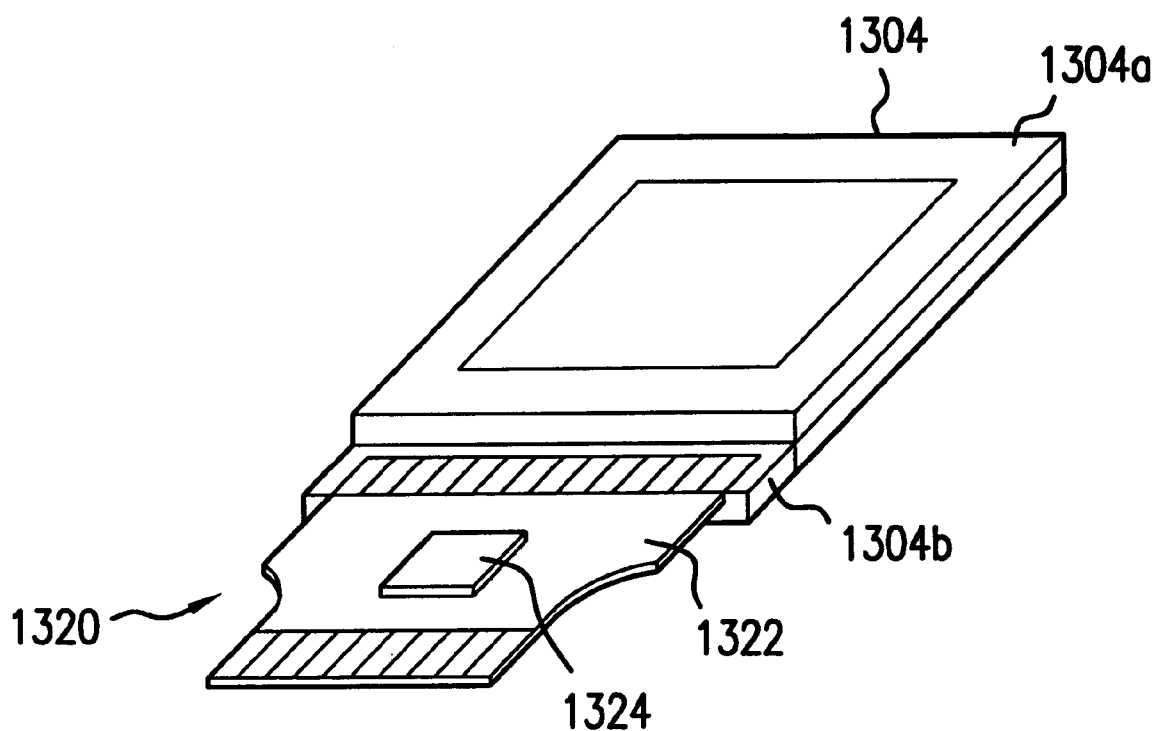
FIG. 21 shows a liquid crystal display device configuration as a part for electronic devices connected to a tape carrier package (TCP) formed in an embodiment of the present invention.

The pager shown in FIG. 20 requires a liquid crystal display substrate 1304 and a circuit board 1308. When a liquid crystal display device is used as a part in an electronic device and a display driving circuit is mounted on a transparent substrate, the minimum unit of the liquid crystal display device is a liquid crystal display substrate 1304. Alternatively, a liquid crystal display substrate 1304 fixed to a metallic frame 1302 as a casing can be used as a liquid crystal display device as a part of an electronic device. In a back light type, a liquid crystal display device is fabricated by assembling a liquid crystal display substrate 1304 and a light guide 1306 provided with a back light 1306a into the metallic frame 1302. Alternatively, as shown in FIG. 21, a tape carrier package (TCP) 1320 composed of a polyimide tape 1322 provided with a metallic conductive film and an IC chip 1324 mounted thereon is connected to one of two transparent substrates 1304a and 1304b in a liquid crystal display substrate 1304 in order to be used as a liquid crystal display device which is a part of the electronic device.

The present invention is not limited to the above-mentioned examples and permits various modifications within the scope of the present invention. For example, the present invention is applicable to electroluminescence devices and plasma display devices other than various liquid crystal panels.

INDUSTRIAL APPLICABILITY

In accordance with the method for making the thin film transistor as described above, by the wet annealing treatment after forming the gate electrode facing the source and drain regions and the channel region separated by the gate insulating film, bonds between atoms in the silicon oxide films such as the gate insulating film are stabilized by means of moisture, hence the change in electrical characteristics of the thin film transistor is reduced, resulting in improved reliability. In particular, wet annealing under conditions of a temperature of 300° C. or more and for a duration of at least one hour can effectively reduce the change in Vgs-Ids characteristics in the BT test and the current stress test.

What is claimed is:

1. A method for making a thin film transistor comprising a channel region composed of a non-single-crystal silicon thin film facing a gate electrode with a gate insulating film therebetween, the method comprising:

providing said gate insulating film including a silicon oxide film; and wet-annealing said gate insulating film in a moist atmosphere after forming said gate insulating film.

2. A method for making a thin film transistor according to either claim 1, wherein said gate insulating film is formed by a PECVD process or a TEOS-PECVD process.

3. A method for making a thin film transistor according to claim 1, wherein said wet annealing in a moist atmosphere is performed at a temperature of at least 300° C. and for a time of at least one hour.

4. A method for making a thin film transistor according to claim 1, further comprising forming an insulating interlevel film composed of a silicon oxide film covering said non-single-crystal silicon thin film and said gate electrode, said wet annealing being performed after forming said insulating interlevel film.

5. A liquid crystal display device comprising a thin film transistor made by the method for making a thin film transistor according to claim 1.

6. An electronic device comprising a thin film transistor made by the method for making a thin film transistor according to claim 1.

7. A thin film transistor made by the method for making a thin film transistor according to claim 1.

8. A method for making a thin film transistor according to claim 1, wherein said gate insulating film is wet-annealed immediately after forming said gate insulating film.

9. A method for making a thin film transistor according to claim 4, wherein said insulating interlevel film is a silicon oxide film formed by a TEOS-PECVD process.

10. A method for making a thin film transistor, comprising:

forming a non-single-crystal silicon thin film having source and drain regions and a channel region on a glass substrate;

forming a gate electrode facing said channel region separated by a gate insulating film composed of a silicon oxide film;

forming source and drain electrodes connect to said source and drain regions, respectively; and wet annealing said glass substrate in a moist atmosphere of at least 300° C. for at least one hour.

11. A method for making a thin film transistor according to claim 10, further comprising forming an underlying insulating film composed of a silicon oxide film on the glass substrate, and forming said non-single crystal silicon thin film on said underlying insulating film.

12. A method for making a thin film transistor according to claim 10, wherein said gate insulating film is formed by a PECVD process or a TEOS-PECVD process.

13. A method for making a thin film transistor according to claim 10, wherein said wet annealing in a moist atmosphere is performed at a temperature of at least 300° C. and for a time of at least one hour.

14. A method for making a thin film transistor according to claim 10, further comprising the step of forming an insulating interlevel film composed of a silicon oxide film covering said non-single-crystal silicon thin film and said gate electrode, said wet annealing being performed after forming said insulating interlevel film.

15. A liquid crystal display device comprising a thin film transistor made by the method for making a thin film transistor according to claim 10.

16. An electronic device comprising a thin film transistor made by the method for making a thin film transistor according to claim 10.

17. A thin film transistor made by the method for making a thin film transistor according to claim 10.

18. A method for making a thin film transistor according to claim 10, wherein said step of wet annealing is performed subsequent to the step of forming a gate electrode.

19. A method for making a thin film transistor according to claim 10, wherein said step of wet annealing is performed immediately subsequent to the step of forming a non-single crystal silicon thin film.

20. A method for making a thin film transistor according to claim 11, wherein said wet annealing is performed in a moist atmosphere after forming said underlying insulating film.

21. A method for making a thin film transistor according to claim 11, wherein said underlying insulating film is formed by a PECVD or TEOS-PECVD process.

22. A method for making a thin film transistor according to claim 11, wherein the thickness of said underlying insulating film is in the range of from 100 nm to 500 nm.

23. A method for making a thin film transistor comprising a gate electrode on a substrate, a channel region composed of a non-single-crystal silicon thin film facing said gate electrode and a gate insulating film composed of a silicon oxide film therebetween, comprising:

inserting said substrate including at least said gate insulating film into a hot wall system; and wet annealing said substrate in a moist atmosphere.

24. A method for making a thin film transistor according to claim 23, wherein said wet annealing is performed in a moist atmosphere having a partial pressure of water of at least 10 Torr.

25. A method for making a thin film transistor according to claim 23, wherein said wet annealing is performed at a temperature of 300° C. to 500° C.

26. A method for making a thin film transistor according to claim 23, wherein said wet annealing is performed at a temperature of 300° C. to 500° C. and for a time of at least one hour.

27. A thin film transistor made by the method for making a thin film transistor according to claim 23.

28. A thin film transistor, comprising:

a substrate;

a channel region composed of a non-single crystal silicon on the substrate;

a gate electrode facing the channel region; and a gate insulating film composed of a silicon oxide film between the channel region and the gate electrode, the silicon oxide film being wet annealed in a moist atmosphere at a temperature of at least 300° C. and for a time of at least one hour.

29. A thin film transistor, comprising:

a glass substrate;

a non-single crystal silicon thin film having source regions, drain regions and a channel region on the glass substrate;

a gate electrode facing the channel region;

a gate insulating film composed of a silicon oxide film between the channel region and the gate electrode, the silicon oxide film being wet annealed in a moist atmosphere at a temperature of at least 300° C. and for a time of at least one hour;

a source electrode connected to the source region; and a drain electrode connected to the drain region.

* * * * *